United States Patent
Shin et al.

(10) Patent No.: US 10,847,551 B2
(45) Date of Patent: Nov. 24, 2020

(54) THIN FILM TRANSISTOR SUBSTRATE AND METHOD FOR MANUFACTURING THE SAME

(71) Applicant: LG Display Co., Ltd., Seoul (KR)

(72) Inventors: Hyunsoo Shin, Gyeonggi-do (KR); Uijin Chung, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 10 days.

(21) Appl. No.: 16/047,875

(22) Filed: Jul. 27, 2018

(65) Prior Publication Data

US 2018/0350848 A1 Dec. 6, 2018

Related U.S. Application Data

(62) Division of application No. 15/133,419, filed on Apr. 20, 2016, now Pat. No. 10,074,675.

(30) Foreign Application Priority Data

Apr. 20, 2015 (KR) ........................ 10-2015-0055226

(51) Int. Cl.
*H01L 27/12* (2006.01)
*H01L 29/786* (2006.01)

(52) U.S. Cl.
CPC ........ *H01L 27/1251* (2013.01); *H01L 27/127* (2013.01); *H01L 27/1222* (2013.01);
(Continued)

(58) Field of Classification Search
None
See application file for complete search history.

(56) References Cited

U.S. PATENT DOCUMENTS 8,421,090 B2    4/2013    Choi
8,659,092 B2    2/2014    Chen et al.
(Continued)

FOREIGN PATENT DOCUMENTS

CN    103887328 A    6/2014
WO    2015/052991 A1    4/2015

OTHER PUBLICATIONS

The First Office Action dated Jun. 8, 2018, from the State Intellectual Property Office of People's Republic of China in counterpart Chinese application No. 201610248158.X.
(Continued)

*Primary Examiner* — Abul Kalam
(74) *Attorney, Agent, or Firm* — Morgan, Lewis & Bockius LLP

(57) ABSTRACT

A thin film transistor substrate includes a substrate; a first thin film transistor on the substrate and including a polycrystalline semiconductor layer, a first gate electrode on the polycrystalline semiconductor layer, a first source electrode, and a first drain electrode; a second thin film transistor on the substrate and including a second gate electrode, an oxide semiconductor layer on the second gate electrode, a second source electrode, and a second drain electrode; an intermediate insulating layer on the first gate electrode and the second gate electrode and under the oxide semiconductor layer; and a dummy layer between the first source electrode and the intermediate insulating layer and between the first drain electrode and the intermediate insulating layer, wherein the dummy layer is formed of a same material as the oxide semiconductor layer.

2 Claims, 15 Drawing Sheets

(52) U.S. Cl.
CPC ...... *H01L 27/1225* (2013.01); *H01L 27/1248* (2013.01); *H01L 29/7869* (2013.01); *H01L 29/78675* (2013.01); *H01L 29/78696* (2013.01)

(56) References Cited

U.S. PATENT DOCUMENTS

| | | |
|---|---|---|
| 9,082,792 B2 | 7/2015 | Chen et al. |
| 2011/0012104 A1 | 1/2011 | Kang et al. |
| 2011/0049507 A1 | 3/2011 | Choi |
| 2012/0153277 A1 | 6/2012 | Yaginuma et al. |
| 2015/0053935 A1 | 2/2015 | Gupta et al. |
| 2015/0243688 A1 | 8/2015 | Lee et al. |
| 2015/0243689 A1 | 8/2015 | Lee et al. |
| 2015/0243723 A1 | 8/2015 | Cho et al. |
| 2015/0243724 A1 | 8/2015 | Cho et al. |
| 2016/0247831 A1* | 8/2016 | Makita ................ H01L 27/1225 |

OTHER PUBLICATIONS

Communication from the European Patent Office dated Sep. 6, 2016 in counterpart European application No. 16166197.0.

* cited by examiner

THIN FILM TRANSISTOR SUBSTRATE AND METHOD FOR MANUFACTURING THE SAME

This application is a Divisional of U.S. patent application Ser. No. 15/133,419, filed Apr. 20, 2016, which claims the priority benefit of Korean Patent Application No. 10-2015-0055226, filed on Apr. 20, 2015, both which are incorporated herein by reference for all purposes as if fully set forth herein.

BACKGROUND OF THE INVENTION

Field of the Invention

The present disclosure relates to a thin film transistor substrate, and more particularly, to a thin film transistor substrate having two different types of thin film transistors on the same substrate and a method for manufacturing the same.

Discussion of the Related Art

Nowadays, as the information society is developed, the requirements of displays for representing information are increasing. Accordingly, various flat panel displays (or 'FPD') are developed for overcoming many drawbacks of the cathode ray tube (or 'CRT') such as heavy weight and bulk volume. Flat panel display devices include a liquid crystal display device (or 'LCD'), a plasma display panel (or 'PDP'), an organic light emitting display device (or 'OLED') and a electrophoresis display device (or 'ED').

The display panel of a flat panel display may include a thin film transistor substrate having a thin film transistor allocated in each pixel region arrayed in a matrix manner. For example, the liquid crystal display device (or 'LCD') represents video data by controlling the light transitivity of the liquid crystal layer using electric fields. The organic light emitting diode display represents video data by generating properly controlled light at each pixel disposed in a matrix manner using an organic light emitting diode formed in each pixel.

As a self-emitting display device, the organic light emitting diode display device has merits including very fast response speed, high brightness, and large viewing angle. The organic light emitting diode display (or OLED) using the organic light emitting diode having good energy efficiency can be categorized in the passive matrix type organic light emitting diode display (or PMOLED) and the active matrix type organic light emitting diode display (or AMOLED).

As personal appliances have been more adopted, portable and/or wearable devices have been actively developed. To apply the display device for a portable and/or wearable device, the device should have low power consumption. However, using already developed technologies, a limitation has been getting a display with low power consumption.

SUMMARY OF THE INVENTION

Accordingly, the present invention is directed to a thin film transistor substrate and method for manufacturing the same that substantially obviate one or more of the problems due to limitations and disadvantages of the related art.

An object of the present invention is to provide a thin film transistor substrate for a flat panel display having at least two transistors having different characteristics from each other on the same substrate.

Another object of the present invention is to provide a thin film transistor substrate for a flat panel display having two different types of transistors manufactured with an efficient manufacturing process and reduced number of mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to overcome the above mentioned drawbacks, the purpose of the present disclosure is to suggest a thin film transistor substrate for flat panel display having at least two transistors of which characteristics are different each other on the same substrate, and a method for manufacturing the same. Another purpose of the present disclosure is to suggest a method for manufacturing a thin film transistor substrate for flat panel display having two different type transistors by the optimized processes and the minimized number of the mask processes, and a thin film transistor substrate by the same method.

To achieve these and other advantages and in accordance with the purpose of the present invention, as embodied and broadly described, a thin film transistor substrate comprises a substrate; a first thin film transistor on the substrate and including a polycrystalline semiconductor layer, a first gate electrode on the polycrystalline semiconductor layer, a first source electrode, and a first drain electrode; a second thin film transistor on the substrate and including a second gate electrode, an oxide semiconductor layer on the second gate electrode, a second source electrode, and a second drain electrode; an intermediate insulating layer on the first gate electrode and the second gate electrode and under the oxide semiconductor layer; and a dummy layer between the first source electrode and the intermediate insulating layer and between the first drain electrode and the intermediate insulating layer, wherein the dummy layer is formed of a same material as the oxide semiconductor layer.

In another aspect, a thin film transistor substrate comprises a substrate; a first semiconductor layer on the substrate and including a polycrystalline semiconductor material; a gate insulating layer covering the first semiconductor layer; a first gate electrode on the gate insulating layer and overlapping the first semiconductor layer; a second gate electrode on the gate insulating layer; an intermediate insulating layer covering the first gate electrode and the second gate electrode; a second semiconductor layer on the intermediate insulating layer, and including an oxide semiconductor material overlapping the second gate electrode; a first source electrode and a first drain electrode on the intermediate insulating layer, and including dummy layers having the oxide semiconductor material thereunder; and a second source electrode and a second drain electrode on the second semiconductor layer.

In another aspect, A method for manufacturing a thin film transistor substrate comprises forming a first semiconductor layer on a substrate; depositing a gate insulating layer covering the first semiconductor layer; forming a first gate electrode and a second gate electrode on the gate insulating layer; depositing an intermediate insulating layer covering the first gate electrode and the second gate electrode; depositing a second semiconductor material on the intermediate insulating layer; exposing a first portion and a second portion of the first semiconductor layer by forming first and second contact holes through the second semiconductor material, the intermediate insulating layer. and the gate insulating layer; depositing a source-drain metal material on the second semiconductor material; and forming a first source electrode, a first drain electrode, a second source electrode, a second drain electrode and a second semiconductor layer, by patterning the source-drain metal material and the second semiconductor material at the same time.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
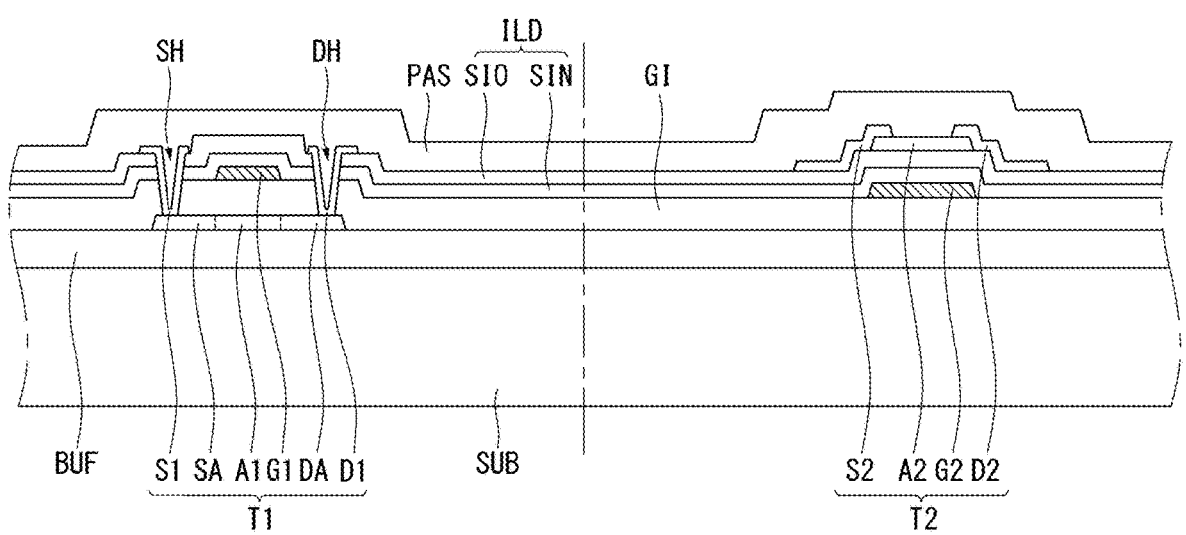
FIG. 1 is a cross sectional view illustrating a structure of a thin film transistor substrate for a flat panel display in which two different type thin film transistors are formed, according to a first embodiment of the present disclosure.

Hereinafter, the meaning for the term of "on" includes "directly on" and "indirectly on" in all scopes of the specifications. Of course, the meaning for the term of "under" includes "directly under" and "indirectly under" in all scopes of the specifications.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names.

The thin film transistor substrate for a flat panel display according to the present disclosure comprises a first thin film transistor disposed in a first area and a second thin film transistor disposed in a second area, on the same substrate. The substrate may include a display area and a non-display area. In the display area, a plurality of pixel area is arrayed in a matrix manner. In one pixel area, the display elements are disposed. In the non-display area surrounding the display area, the driver elements for driving the display elements in the pixel area are disposed.

Here, the first area may be the non-display area, and the second area may be some portions or all portions of the display area. In this case, the first thin film transistor and the second thin film transistor are disposed as they may be apart from each other. Otherwise, the first area and the second area may be included in the display area. Especially, for the case that a plurality of thin film transistor are disposed in one pixel area, the first thin film transistor and the second thin film transistor may be closely disposed.

As the polycrystalline semiconductor material has the characteristics of high mobility (over 100 $cm^2/Vs$) and of low energy consumption power, and it has high reliability, it is proper to apply to the driver IC, such as the gate driver and/or the multiplexer (or 'MUX') for driving the display elements. In addition, it can be applied to the driving thin film transistor disposed in the pixel area of the organic light emitting diode display. As the oxide semiconductor material has low off-current, it is proper to apply to the channel layer of the switching thin film transistor in the pixel area, in which the ON time period is very short but the OFF time period is long. Further, as the off-current is low, the holding time of the pixel voltage may be long, so that it is preferable to apply the display with low frequency drive and/or low power consumption. By disposing these two different type thin film transistors, the present disclosure suggests a thin film transistor substrate having an optimized function and characteristic for the portable and/or wearable displays.

When the semiconductor layer is formed using the polycrystalline semiconductor material, the doping process and high temperature treatment process are used. On the contrary, when the semiconductor layer is formed using the oxide semiconductor material, it is performed under a relatively lower temperature process. Therefore, the polycrystalline semiconductor layer, formed under a more severe heat condition, may be first formed, and after that, the oxide semiconductor layer may be formed. To do so, in the present disclosure, the first thin film transistor having the polycrystalline semiconductor material may have a top gate structure, and the second thin film transistor having the oxide semiconductor material would have a bottom gate structure.

Further, in view of manufacturing process, when the polycrystalline semiconductor material has a lot of vacancy, the characteristics may be severely degraded. Therefore, a hydrogenation process may be performed in which the vacancies are filled with hydrogen particles. On the other hand, for the oxide semiconductor material, the vacancies may act as the carriers so it may be desired that the thermal treatment be performed with a small amount of vacancies in the oxide semiconductor material. These processes, the hydrogenation process and the thermal treatment, can be performed by a post-thermal process under a 350~380° C. temperature condition.

For the hydrogenation process, a nitride layer having a lot of hydrogen particles may be provided over the polycrystalline semiconductor material. As the materials used for depositing the nitride layer has a large amount of hydrogen, a lot of hydrogen particles may be included into the deposited nitride layer. By the thermal process, the hydrogen particles can be diffused into the polycrystalline semiconductor material. As the result, the polycrystalline semiconductor layer can be stabilized. During the thermal process, it is preferable that too much of the hydrogen particles should not be diffused into the oxide semiconductor material. Therefore, an oxide layer should be disposed between the nitride layer and the oxide semiconductor material. As a result, the oxide semiconductor layer can be stabilized but may be affected too much by the hydrogen particles.

Hereinafter, for convenience, the first thin film transistor is for the driver IC disposed in the non-display area and the second thin film transistor is for the display element disposed in the pixel area of the display area. However, embodiments are not restricted to this case. For example, in an organic light emitting diode display, the first thin film transistor and the second thin film transistor may be disposed at one pixel area in the display area. Especially, the first thin film transistor having the polycrystalline semiconductor material may be applied for the driving thin film transistor, and the second thin film transistor having the oxide semiconductor material may be applied for the switching thin film transistor.

First Embodiment

FIG. 1 is a cross sectional view illustrating a structure of a thin film transistor substrate for a flat panel display in which two different type thin film transistors are formed, according to a first embodiment of the present disclosure. Here, the cross sectional views more clearly and conveniently show the main features of the present disclosure.

With reference to FIG. 1, the thin film transistor substrate for a flat panel display according to the first embodiment comprises a first thin film transistor T1 and a second thin film transistor T2 which are disposed on the same substrate SUB. The first and second thin film transistors T1 and T2 may be apart far from each other, or they may be disposed within a relatively close distance. Otherwise these two thin film transistors are disposed as being overlapping each other.

On the whole surface of the substrate SUB, a buffer layer BUF is deposited. In some cases, the buffer layer BUF may not be included. Or, the buffer layer BUF may be a plurality of layers. Here, for convenience, a single layer arrangement of layers will be explained. Further, a light shield layer may be included at some required areas between the substrate SUB and the buffer layer BUF. The light shield layer may be further disposed to prevent the light from inducing into the semiconductor layer of the thin film transistor disposed thereon.

On the buffer layer BUF, a first semiconductor layer A1 is disposed. The first semiconductor layer A1 includes a channel area of the first thin film transistor T1. The channel area is defined as the overlapped area between the first gate electrode G1 and the first channel layer A1. As the first gate electrode G1 is overlapped with the middle portions of the first semiconductor layer A1, the middle portion of the first semiconductor layer A1 is the channel area. The two areas expanded to both sides of the channel area where the impurities are doped are defined as the source area SA and the drain area DA, respectively.

For the case that the first thin film transistor T1 is for driver IC, the semiconductor layer may have a characteristic for high speed performance with a lower power consumption. For example, P-MOS type or N-MOS type thin film transistor may be used or C-MOS type may be applied for the first thin film transistor T1. The P-MOS, N-MOS and/or C-MOS type thin film transistor may have a polycrystalline semiconductor material, such as poly-crystalline silicon (p-Si). Further, the first thin film transistor T1 preferably has a top gate structure.

On the whole surface of the substrate SUB having the first semiconductor layer A1, a gate insulating layer GI is deposited. The gate insulating layer GI may be made of the silicon nitride (SiNx) material or the silicon oxide (SiOx) material. The gate insulating layer GI may have a thickness of 1,000 Å~1,500 Å for ensuring the stability and characteristics of the elements. In the case that the gate insulating layer GI may be made of silicon nitride (SiNx), in the view point of manufacturing process, the gate insulating layer GI includes a lot of hydrogen particles. As these hydrogen particles would be diffused out from the gate insulating layer GI, the gate insulating layer GI may be made of the silicon oxide material.

The diffusion of the hydrogen particles may cause positive effects on the first semiconductor layer A1 including polycrystalline semiconductor material. However, it may cause negative effects on the second thin film transistor T2 having different material from the first thin film transistor T1. Therefore, when at least two thin film transistors having different characteristics each other are formed on the same substrate SUB, the gate insulating layer GI may be made of silicon oxide (SiOx), which is less likely to affect the semiconductor material. In some cases, unlike in the first embodiment, the gate insulating layer GI may be deposited as having the thickness of 2,000 Å~4,000 Å. In those cases, when the gate insulating layer GI is made of the nitride silicon (SiNx), much more of the hydrogen particles may be diffused. Considering these cases, the gate insulating layer GI may be an oxide layer, such as silicon oxide (SiOx).

On the gate insulating layer GI, a first gate electrode G1 and the second gate electrode G2 are disposed. The first gate electrode G1 is disposed over the middle portion of the first semiconductor layer A1. The second gate electrode G2 is located where the second thin film transistor T2 is disposed. The first and the second gate electrodes G1 and G2 are formed on the same layer, with the same material, and by using the same mask process. Therefore, the manufacturing process can be simplified.

An intermediate insulating layer ILD is deposited covering the first and the second gate electrodes G1 and G2. The intermediate insulating layer ILD has a multiple layer structure, in which a nitride layer SIN including a silicon nitride (SiNx) and an oxide layer SIO including a silicon oxide (SiOx) are alternatively stacked. Here, for convenience of explanation, the intermediate insulating layer ILD, as described, includes two layers in which the oxide layer SIO is stacked on the nitride layer SIN.

The nitride layer SIN is deposited for performing the hydrogenation process to the first semiconductor layer A1 having the polycrystalline silicon by diffusing the hydrogen particles into the polycrystalline silicon. On the contrary, the oxide layer SIO is for preventing the hydrogen particles of the nitride layer SIN from being diffused too much into the semiconductor material of the second thin film transistor T2.

For example, the hydrogen going out from the nitride layer SIN may diffuse into the first semiconductor layer A1 under the gate insulating layer GI. Therefore, the nitride layer SIN may be deposited as close to the gate insulating layer GI as possible. On the contrary, the hydrogen going out from the nitride layer SIN would not diffuse too much into the semiconductor material of the second thin film transistor T2 over the gate insulating layer GI. Therefore, on the nitride layer SIN, the oxide layer SIO should be deposited. Considering the manufacturing process, the intermediate insulating layer ILD may have a thickness of 2,000 Å~6,000 Å. Therefore, each thickness of the nitride layer SIN and the oxide layer SIO may have a thickness of 1,000 Å~3,000 Å, respectively. Further, in order that much more amount of the hydrogen particles from the nitride layer SIN into the first semiconductor layer A1, but the hydrogen particles may not affect the second semiconductor layer A2, it is preferable that the oxide layer SIO is thicker than the gate insulating layer GI. In addition, as the oxide layer SIO is for controlling the hydrogen diffusion amount, it is preferable that the oxide layer SIO is thicker than the nitride layer SIN.

Especially, on the oxide layer SIO of the intermediate insulating layer ILD, a second semiconductor layer A2 overlapping with the second gate electrode G2 is disposed. The second semiconductor layer A2 includes the channel area of the second thin film transistor T2. For the case that the second thin film transistor T2 is applied for the display element, the second semiconductor layer A2 may have characteristics proper to perform the switching element. For example, the second semiconductor layer A2 may include an oxide semiconductor material, such as indium gallium zinc oxide (or 'IGZO), indium gallium oxide (or 'IGO'), or indium zinc oxide (or 'IZO'). The oxide semiconductor material has a merit for driving the device with relatively low frequency. Due to these characteristics, the pixels may have long period for holding the pixel voltage, and consequentially, it may be desirable to apply the display with a low frequency drive and/or low power consumption. For the thin film transistor having the oxide semiconductor material, considering the structure in which two different type thin film transistors are formed on the same substrate, it is preferable that the oxide semiconductor thin film transistor has a bottom gate structure for ensuring the stability of the elements.

On the second semiconductor layer A2 and the intermediate insulating layer ILD, the source-drain electrodes are disposed. The first source electrode S1 and the first drain electrode D1 are disposed facing each other with a predetermined distance across the first gate electrode G1. The first source electrode S1 is connected to one side of the first semiconductor layer A1, a source area SA through a source contact hole SH. The source contact hole SH exposes the one side of the first semiconductor layer A1, the source area SA, by penetrating the intermediate insulating layer ILD and the gate insulating layer GI. The first drain electrode D1 is connected to the other side of the first semiconductor layer A1, a drain area DA, through a drain contact hole DH. The drain contact hole DH exposes the other side of the first semiconductor layer A1, the drain area DA, by penetrating the intermediate insulating layer ILD and the gate insulating layer GI.

The second source electrode S2 and the second drain electrode D2 are disposed facing each other with a predetermined distance across the second gate electrode G2, and as contacting the upper surfaces of the one side and the other side of the second semiconductor layer A2. The second source electrode S2 directly contacts the upper surface of the intermediate insulating layer ILD and the one upper surface of the second semiconductor layer A2. The second drain electrode D2 directly contacts the upper surface of the intermediate insulating layer ILD and the other upper surface of the second semiconductor layer A2.

On the whole surface of the substrate SUB having the first thin film transistor T1 and the second thin film transistor T2, a passivation layer PAS is deposited. Further, by patterning the passivation layer PAS, contact holes for exposing the first drain electrode D1 and/or the second drain electrode D2 may be included. In addition, on the passivation layer PAS, a pixel electrode (e.g., anode electrode for the organic light emitting diode display) may be included as connecting to the first drain electrode D1 and/or second drain electrode D2. Here, for convenience, the structure of the thin film transistor showing the main features of the present disclosure will be explained.

As mentioned above, the thin film transistor substrate for the flat panel display according to the first embodiment of the present disclosure suggests the structure in which the first thin film transistor T1 has a polycrystalline semiconductor material and the second thin film transistor T2 has a oxide semiconductor material, on the same one substrate SUB. Especially, the first gate electrode G1 of the first thin film transistor T1 and the second gate electrode G2 of the second thin film transistor T2 are formed on the same layer with the same metal material.

The first semiconductor layer A1 of the first thin film transistor T1 having the polycrystalline semiconductor material is disposed under the first gate electrode G1, but the second semiconductor layer A2 of the second thin film transistor T2 having the oxide semiconductor material is disposed over the second gate electrode G2. The first semiconductor layer A1 which may be manufactured under the relatively higher temperature condition is formed first. After that, the second semiconductor layer A2, which may be manufactured under the relatively lower temperature condition, is formed. As a result, the oxide semiconductor material is not exposed by the high temperature condition, during the whole manufacturing processes. As the first semiconductor layer A1 is formed before forming the first gate electrode G1, the first thin film transistor T1 has a top-gate structure. As the second semiconductor layer A1 is formed after forming the second gate electrode G2, the second thin film transistor T2 has a bottom-gate structure.

Further, in the thermal treatment process for the second semiconductor layer A2 including the oxide semiconductor material, the hydrogenation process for the first semiconductor layer A1 including the polycrystalline semiconductor material can be performed, at the same time. To do so, it is preferable that the intermediate insulating layer ILD includes two stacked layers as disposing an oxide layer SIO over a nitride layer SIN. In the view of manufacturing process, a hydrogenation may be used for diffusing the hydrogen particles into the first semiconductor layer A1. Further, it is advantageous for performing a thermal treatment for stabilizing the second semiconductor layer A2 including the oxide semiconductor material. The hydrogenation process may be performed after depositing the nitride layer SIN on the first semiconductor layer A1, and the thermal treatment may be performed after forming the second semiconductor layer A2. According to the first embodiment of the present disclosure, as the oxide layer SIO is deposited between the nitride layer SIN and the second semiconductor layer A2, the hydrogen particles can be prevented from diffusing too much into the second semiconductor layer A2 including the oxide semiconductor material. Therefore, in this first embodiment of the present disclosure, during the thermal treatment for the oxide semiconductor material, the hydrogenation process may be performed at the same time.

Figure 2:
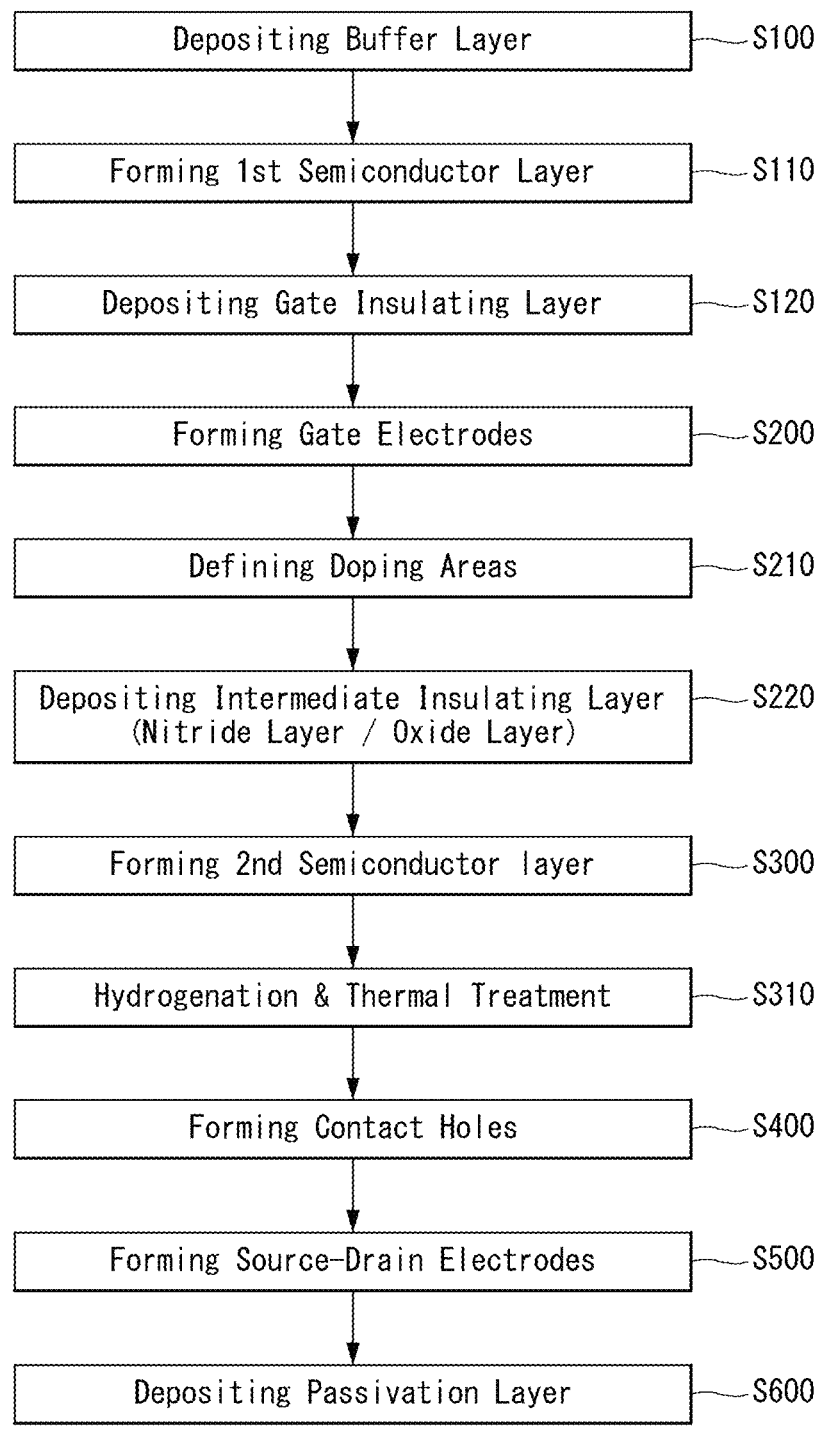
FIG. 2 is a flow chart illustrating a method for manufacturing the thin film transistor substrate for a flat panel display in which two different type thin film transistors are formed, according to the first embodiment of the present disclosure.

FIG. 2 is a flow chart illustrating a method for manufacturing the thin film transistor substrate having two different types of thin film transistors according to the first embodiment of the present disclosure.

In step S100, on a substrate SUB, a buffer layer BUF is deposited. Even though it is not shown in figures, before depositing the buffer layer BUF, a light shield layer may be formed at desired area.

In step S110, on the buffer layer BUF, an amorphous silicon (a-Si) material is deposited. Performing the crystallization process, the amorphous silicon layer is converted into the polycrystalline silicon (poly-Si). Using a first mask process, the polycrystalline silicon layer is patterned to form a first semiconductor layer A1.

In step S120, by depositing an insulating material, such as silicon oxide, on the whole surface of the substrate SUB having the first semiconductor layer A1, a gate insulating layer GI is formed. The gate insulating layer GI preferably includes the silicon oxide. Here, the gate insulating layer GI may have a thickness of 1,000 Å or more and 1,500 Å or less.

In step S200, on the gate insulating layer GI, a gate metal material is deposited. Using a second mask process, the gate metal layer is patterned to form the gate electrodes. Especially, a first gate electrode G1 for the first thin film transistor T1 and a second gate electrode G2 for the second thin film transistor T2 are formed at the same time. The first gate electrode G1 is disposed as overlapping with the middle portion of the first semiconductor layer A1. The second gate electrode G2 is disposed where the second thin film transistor T2 is formed.

In step S210, using the first gate electrode G1 as a mask, impurity materials are doped into some portions of the first semiconductor layer A1 so that doping areas including a source area SA and a drain area DA may be defined. The detailed manufacturing process for the doping areas may be a little bit different according to the types of thin film transistor (e.g., P-MOS type, N-MOS type and/or C-MOS type). For example, for the N-MOS type, a high density doping area may be formed first, and then a low density doping area may be formed. Using the photo-resist pattern for the first gate electrode G1, which has a wider size than the first gate electrode G1, the high density doping area can be defined. Removing the photo-resist pattern and using the first gate electrode G1 as a mask, the low density doping area (or, 'LDD') can be defined between the high density doping area and the first gate electrode G1. The impurity doping areas are not shown in figures, for convenience.

In step S220, on the whole surface of the substrate SUB having the first gate electrode G1 and the second gate electrode G2, an intermediate insulating layer ILD is deposited. Especially, a nitride layer SIN is firstly deposited and then an oxide layer SIO is sequentially deposited thereon. The nitride layer SIN includes a lot of hydrogen particles during the depositing process. Considering the manufacturing process, the total thickness of the intermediate insulating layer ILD may have a thickness of 2,000 Å~6,000 Å. Here, for the nitride layer SIN of which purpose is the diffusion of the hydrogen particles, considering the hydrogenation efficiency, it preferably has the thickness of 1,000 Å~3,000 Å. As the oxide layer SIO is for preventing the hydrogen particle from diffusing too much into the semiconductor layer disposed over the oxide layer SIO, it may have a thickness of 1,000 Å~3,000 Å. Considering the hydrogen diffusion efficiency and the element properties, the thicknesses of the oxide layer SIO and the nitride layer SIN may be selected and/or decided. For example, to prevent the hydrogen particles from diffusing out too much, the nitride layer SIN is preferably thinner than the oxide layer SIO.

In step S300, on the intermediate insulating layer ILD, especially on the oxide layer SIO, an oxide semiconductor material is deposited. Further, the oxide semiconductor material may be deposited directly on the oxide layer SIO so that the oxide semiconductor material does not directly contact the nitride layer SIN including the hydrogen particles a lot. The oxide semiconductor material includes at least one of Indium Gallium Zinc Oxide (or 'IGZO), Indium Gallium Oxide (or 'IGO'), and Indium Zinc Oxide (or 'IZO). Using a third mask process, the oxide semiconductor material is patterned to form a second semiconductor layer A2. The second semiconductor layer A2 is disposed as overlapping with the second gate electrode G2.

In step S310, performing a post-thermal process to the substrate SUB having the second semiconductor layer A2, the hydrogenation for the first semiconductor layer A1 including the polycrystalline silicon and the thermal treatment for the second semiconductor layer A2 including the oxide semiconductor material are performed at the same time. The post-thermal process may be performed under a 350~380° C. temperature condition. At this time, a large amount of the hydrogen particles included in the nitride layer SIN would be diffused into the first semiconductor layer A1. However, the amount of the hydrogen particles diffused into the second semiconductor layer A2 may be restricted and/or controlled by the oxide layer SIO. In some cases, the hydrogenation process for the first semiconductor layer A1 is performed separately from the thermal treatment for the second semiconductor layer A2. In these cases, the hydrogenation process is first performed after step S220 for depositing the intermediate insulating layer ILD, and then the thermal treatment for the second semiconductor layer A2 is performed by this post-thermal process.

In step S400, using a fourth mask process, the intermediate insulating layer ILD and the gate insulating layer GI are patterned to form a source contact hole SH exposing the one portion of the first semiconductor layer A1 and a drain contact hole DH exposing the other portion of the first semiconductor layer A1. These contact holes SH and DH are for later connecting the source-drain electrode to the first semiconductor layer A1.

Here, steps S300, S310, and S400 may be changed in sequential order in accordance with the manufacturing conditions. For example, step S400 for forming the contact holes may be performed first, step S300 for forming the second semiconductor layer A2 may be performed second, and then of S310 for performing the post-thermal treatment may be performed finally. Otherwise, step S300 for forming the second semiconductor layer A2 may be performed first, step S400 for forming the contact holes may be performed second, then step S310 for performing the post-thermal treatment may be performed finally.

In step S500, a source-drain metal material is deposited on the intermediate layer ILD having the source contact hole SH, the drain contact hole DH and the second semiconductor layer A2. Using a fifth mask process, the source-drain metal material is patterned to form a first source electrode S1, a first drain electrode D1, a second source electrode S2 and a second drain electrode D2. The first source electrode S1 contacts the one area of the first semiconductor layer A1, the source area SA, through the source contact hole SH. The first drain electrode D1 contacts another area of the first semiconductor layer A1, the drain area DA, through the drain contact hole DH. The second source electrode S2 contacts the upper surface of one side of the second semiconductor layer A2. The second drain electrode D2 contacts the upper surface of the other side of the second semiconductor layer A2.

In step S600, on the whole surface of the substrate SUB having the source-drain electrodes, a passivation layer PAS is deposited. Even though not shown in figures, the passivation layer PAS may be patterned to form contact holes for exposing some portions of the first and/or second drain electrodes D1 and/or D2.

Second Embodiment

Figure 3:
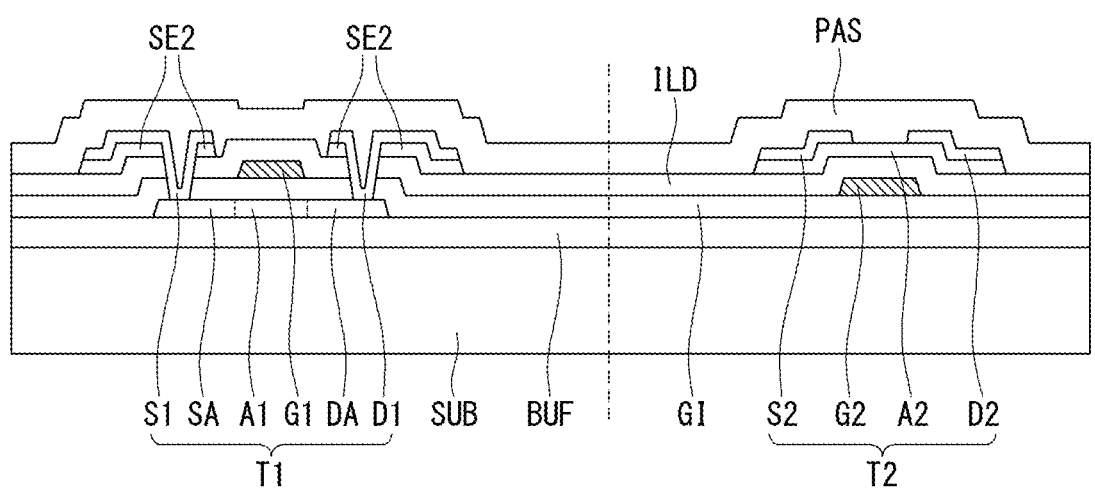
FIG. 3 is a cross sectional view illustrating a structure of a thin film transistor substrate for a flat panel display in which two different types of thin film transistors are formed, according to a second embodiment of the present disclosure.

FIG. 3 is a cross sectional view illustrating a structure of a thin film transistor substrate for a flat panel display in which two different types of thin film transistors are formed according to a second embodiment of the present disclosure.

The thin film transistor substrate according to the second embodiment is similar to that of the first embodiment. In the second embodiment, the source-drain electrode S2-D2 and the second semiconductor layer A2 of the second thin film transistor T2 are formed at the same time during the same mask process. As a result, in the view of the structure, the second semiconductor materials SE2 exist under the first source-drain electrodes S1-D1 of the first thin film transistors T1, while the second semiconductor layer A2 (the same material with the second semiconductor materials SE2) exists under the second source-drain electrodes S2-D2 of the second thin film transistor T2.

For the second thin film transistor T2, the second source electrode S2 and the second drain electrode D2 have the same outer peripheral shape with the second semiconductor layer A2 having the oxide semiconductor material. The second source electrode S2 and the second drain electrode D2 are separated from each other by a predetermined distance corresponding to a space of a channel area defined at a middle portion of the second semiconductor layer A2. That is, the second source electrode S2 is disposed on one side surface of the second semiconductor layer A2 having the oxide semiconductor material. The second drain electrode D2 is disposed on the other side of the second semiconductor layer A2.

In the interim, for the first thin film transistor T1, the second semiconductor materials SE2 having the oxide semiconductor material are inserted between the first source electrode S1 and the intermediate insulating layer ILD and between the first drain electrode D1 and the intermediate insulating layer ILD, as the dummy layers. Specifically, the first source electrode S1 may contact the source area SA, one side area of the first semiconductor layer A1, through the source contact hole SH penetrating the second semiconductor material SE2, the intermediate insulating layer ILD and the gate insulating layer GI. Like that, the first drain electrode D1 may contact the drain area DA, the other side area of the first semiconductor layer A1, through the drain contact hole DH penetrating the second semiconductor material SE2, the intermediate insulating layer ILD and the gate insulating layer GI.

Further, in the second embodiment as illustrated and describe, the intermediate insulating layer ILD is shown and explained as a single layer for convenience. For example, the intermediate insulating layer ILD may be a single layer made of an oxide silicon (SiOx) material. Otherwise, the intermediated insulating layer ILD may have a double layered structure in which an oxide silicon (SiOx) layer is stacked on a nitride silicon (SiNx) layer. Because the structure of the intermediate insulating layer ILD is explain with regard to the first embodiment, a further description is omitted here.

The intermediate layer ILD also acts as a gate insulating layer for the second thin film transistor T2. Therefore, when the intermediate layer ILD is too thick, the gate voltage may not be properly applied to the second semiconductor layer A2. Therefore, the whole thickness of the intermediate layer ILD may have the thickness of 2,000 Å~6,000 Å.

Figure 4:
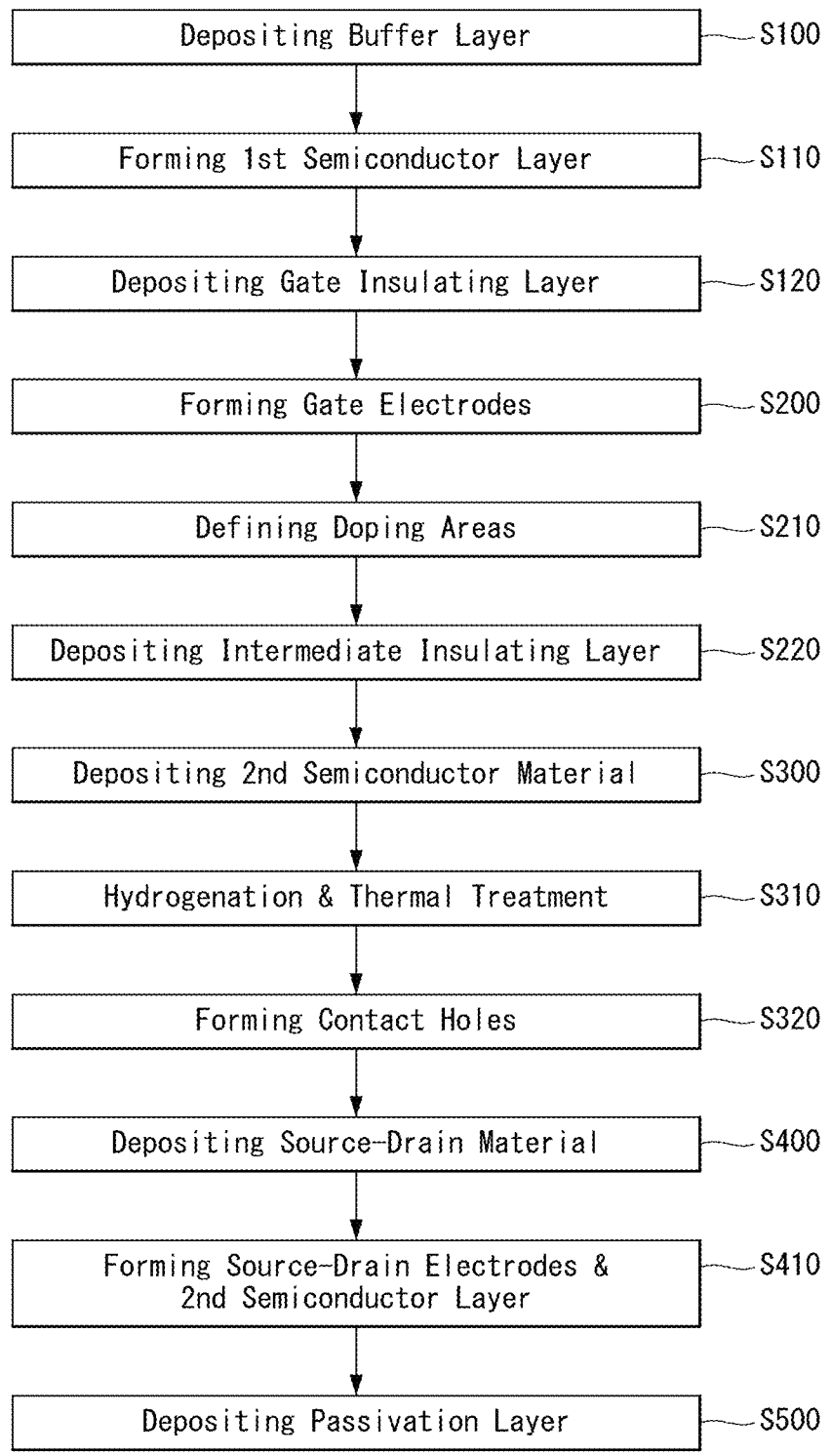
FIG. 4 is a flow chart illustrating a method for manufacturing the thin film transistor substrate for a flat panel display in which two different types of thin film transistors are formed according to the second embodiment of the present disclosure.

As other elements are similar with those of the first embodiment, a detailed explanation thereof will be omitted. Hereinafter, with reference to FIGS. 4 and 5A to 5F, a method for manufacturing the thin film transistor substrate for flat panel display according to the second embodiment of the present disclosure will be explained. Herein, the duplicative explanation will be omitted. FIG. 4 is a flow chart illustrating a method for manufacturing the thin film transistor substrate for a flat panel display in which two different types of thin film transistors are formed according to the second embodiment of the present disclosure. FIGS. 5A to 5F are cross sectional views illustrating the steps for manufacturing the thin film transistor substrate for a flat panel display in which two different types of thin film transistors are formed according to the second embodiment of the present disclosure.

In step S100, on a substrate SUB, a buffer layer BUF is deposited.

In step S110, on the buffer layer BUF, a first semiconductor material SE1 having an amorphous silicon (a-Si) material is deposited. By performing a crystallization process, the amorphous silicon material is converted into a polycrystalline silicon (poly-Si) material. Using a first mask process, the first semiconductor material SE1 having the polycrystalline silicon material is patterned to form a first semiconductor layer A1.

Figure 5A:
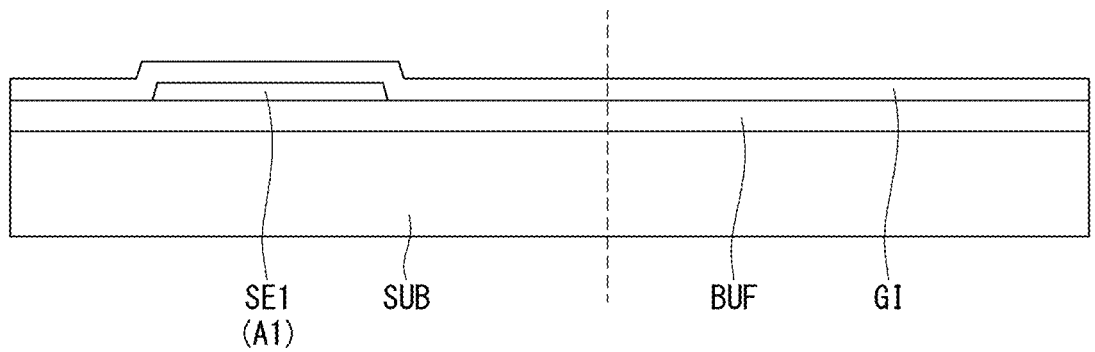
FIGS. 5A to 5F are cross sectional views illustrating the steps for manufacturing the thin film transistor substrate for a flat panel display in which two different types of thin film transistors are formed according to the second embodiment of the present disclosure.

In step S120, depositing an insulating material such as an silicon oxide on the whole surface of the substrate SUB having the first semiconductor layer A1, a gate insulating layer GI is formed. The gate insulating layer GI may be made of silicon oxide with a thickness of 1,000 Å~1,500 Å, as shown in FIG. 5A.

In step S200, on the gate insulating layer GI, a gate metal layer is deposited. Using a second mask process, the gate metal layer is patterned to form the gate electrodes. Here, a first gate electrode G1 for the first thin film transistor T1 and a second gate electrode G2 for the second thin film transistor T2 are formed at the same time. The first gate electrode G1 is disposed to overlap a middle portion of the first semiconductor layer A1. The second gate electrode G2 is disposed where the second thin film transistor T2 is formed.

In step S210, using the first gate electrode G1 as a mask, impurity materials are doped into portions of the first semiconductor layer A1 so that the doped areas define a source area SA and a drain area DA.

Figure 5B:
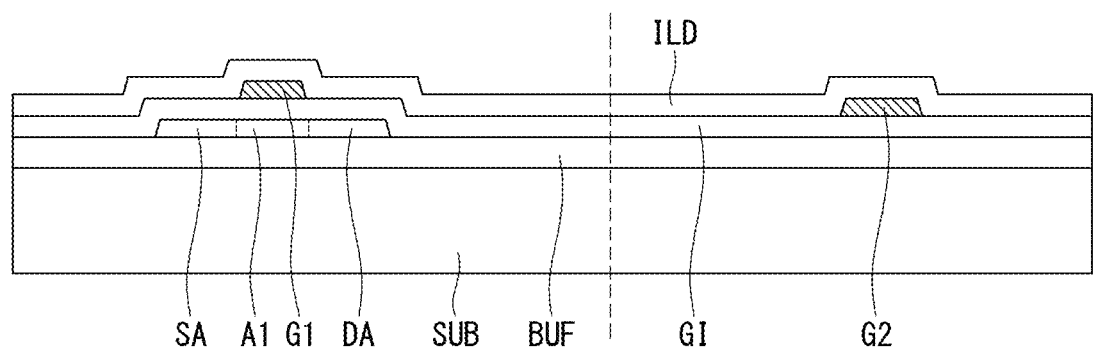

In step S220, on the whole surface of the substrate SUB having the first gate electrode G1 and the second gate electrode G2, an intermediate insulating layer ILD is deposited, as shown in FIG. 5B. Even though it is not shown in figures here, the intermediate insulating layer ILD may have a stacked structure in which the oxide layer is deposited on the nitride layer, in a manner similar to that of the first embodiment. The thicknesses of the oxide layer and the nitride layer may be selected and/or decided in consideration of the hydrogen diffusion efficiency and the element properties. For example, to prevent the hydrogen particles from diffusing out too much, the nitride layer may be thinner than the oxide layer.

In step S300, on the intermediate insulating layer ILD, a second semiconductor material SE2 having an oxide semiconductor material is deposited. If the intermediate insulating layer ILD has a stacked structure in which the oxide layer SIO is deposited on the nitride layer SIN, the second semiconductor material SE2 having the oxide semiconductor material may be deposited directly on the oxide layer SIO to avoid contacting the nitride layer SIN having a lot of hydrogen.

In step S310, performing a post-thermal process to the substrate SUB having the second semiconductor layer A2, the hydrogenation for the first semiconductor layer A1 including the polycrystalline silicon and the thermal treatment for the second semiconductor layer A2 including the oxide semiconductor material are performed at the same time. The post-thermal process may be performed at a temperature condition of 350~380° C. If the oxide layer is stacked on the nitride layer for the intermediate insulating layer ILD, a large amount of the hydrogen particles included into the nitride layer SIN may diffuse into the first semiconductor layer A1. However, the amount of the hydrogen particles diffused into the second semiconductor layer A2 may be restricted and/or controlled by the oxide layer SIO disposed at the upper layer of the nitride layer SIN. In some cases, the hydrogenation process for the first semiconductor layer A1 may be performed separately from the thermal treatment for the second semiconductor layer A2.

Figure 5C:
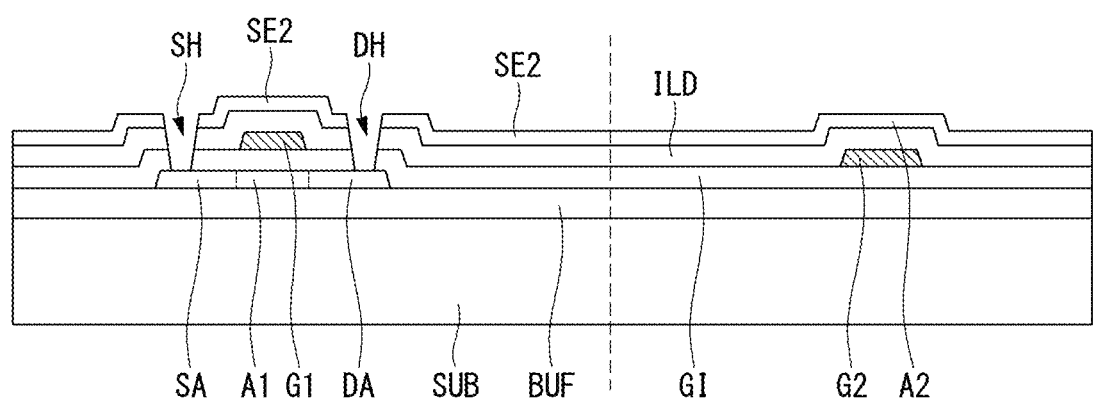

In step S320, using a third mask process, the second semiconductor material SE2, the intermediate insulating layer ILD and the gate insulating layer GI are patterned to form a source contact hole SH and a drain contact hole DH exposing one side portion and the other side portion of the first semiconductor layer A1, respectively, as shown in FIG. 5C.

In step S400, a source-drain metal material SD is deposited on the intermediate insulating layer ILD. Most portions of the source-drain metal SD are stacked on the second semiconductor material SE2. Further, via the source contact hole SH, the source-drain metal SD contacts the source area SA, which is defined at a side portion of the first semiconductor layer A1. Also, via the drain contact hole DH, the source-drain metal SD contacts the drain area SA, which is defined at the other side portion of the first semiconductor layer A1.

After that, using a fourth mask process, the source-drain metal SD and the second semiconductor material SE2 are patterned at the same time to form a first source electrode S and the first drain electrode D1, the second source electrode S2 and the second drain electrode D2 and the second semiconductor layer A2. In the fourth mask process, a half-tone mask may be used for etching two stacked layers in the different thicknesses to form the source-drain electrodes and the semiconductor layer at the same time. Hereinafter, the fourth mask process using the half-tone mask will be explained.

Figure 5D:
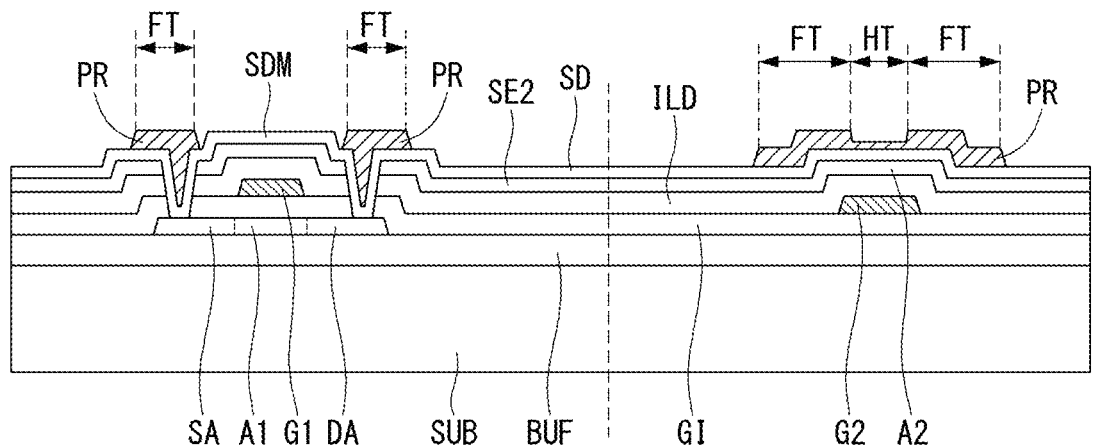

On the source-drain metal SD, a photo resist PR is coated. Using the half-tone mask, the photo resist PR is patterned. For example, for the second thin film transistor, the photo resist PR may be patterned as the full-tone FT may be applied to the area corresponding to the source electrode and the drain electrode, and the half-tone may be applied to the area corresponding to the channel area of the second semiconductor layer. At that time, for the first thin film transistor, the full-tone is also applied to the area corresponding to the source electrode and the drain electrode, as shown in FIG. 5D.

Using the photo resist pattern, the source-drain metal SD and the second semiconductor material SE2 are patterned at the same time to form the first source electrode S1 and the first drain electrode D1, the second source electrode S2 and the second drain electrode D2, and the second semiconductor layer A2. The first source electrode S1 contacts the source area SA of the first semiconductor layer A1 through the source contact hole SH (labeled in FIG. 5C). The source contact hole SH penetrates the second semiconductor material SE2, the intermediate insulating layer ILD and the gate insulating layer GI. As the result, the second semiconductor material SE2 is inserted between the first source electrode S1 and the intermediate insulating layer ILD. Further, the first drain electrode D1 contacts the drain area DA of the first semiconductor layer A1 through the drain contact hole DH. The drain contact hole DH penetrates the second semiconductor material SE2, the intermediate insulating layer ILD and the gate insulating layer GI. As the result, the second semiconductor material SE2 is also inserted between the first drain electrode D1 and the intermediate insulating layer ILD.

Figure 5E:
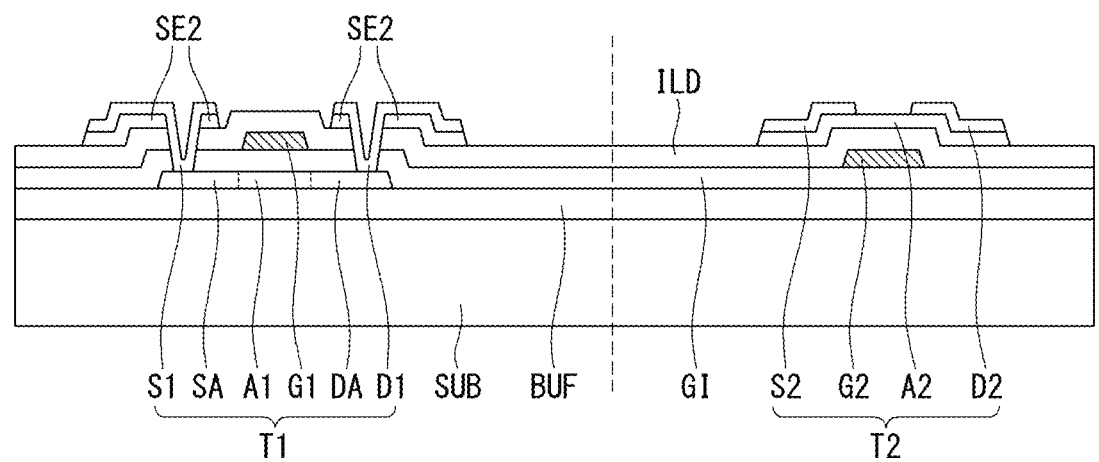

In step S410, the second source electrode S2 and the second drain electrode D2 have the same outer circumference contour profile with the second semiconductor layer A2. Further, the second source electrode S2 and the second drain electrode D2 are separated each other with a predetermined distance there-between. That is, the channel area (i.e., the middle portion of the second semiconductor layer A2) is not covered by the source-drain metal but is instead exposed. Here, the second semiconductor layer A2 overlaps the second gate electrode G2, as shown in FIG. 5E.

Figure 5F:
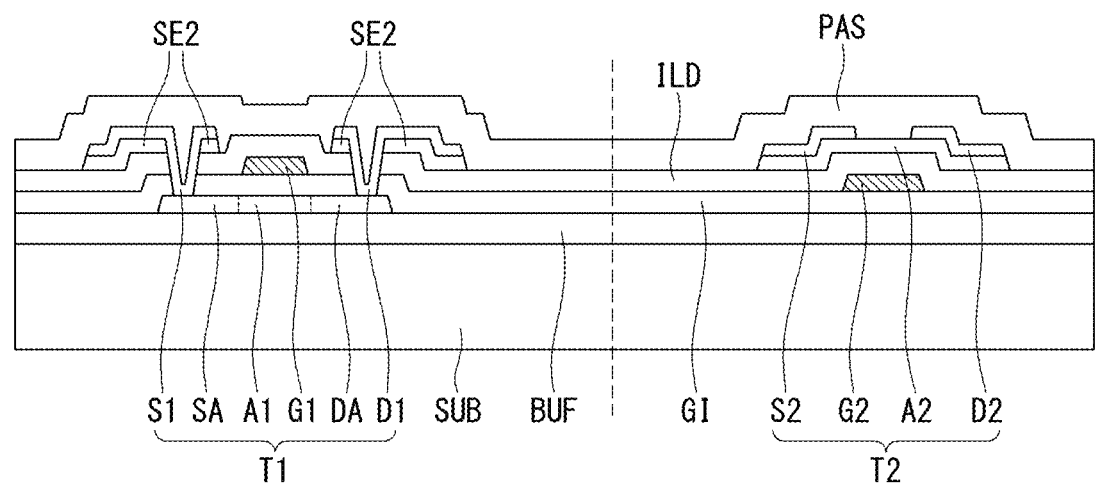

In step S500, on the whole surface of the substrate SUB having the first thin film transistor T1 and the second thin film transistor T2, a passivation layer PAS is deposited, as shown in FIG. 5F.

Here, step S310 for the hydrogenation process and the thermal treatment may be conducted at any time between step S300 for depositing the second semiconductor material and step S500 for depositing the passivation layer in accordance with desired manufacturing conditions and/or circumstances. For example, step S310 may be conducted after step S320 for forming the contact holes, or after step S400 for depositing the source-drain metal. Otherwise, step S310 may be conducted after step S410 for forming the source-drain and the second semiconductor layer.

As compared with the first embodiment, the method for manufacturing the thin film transistor substrate according to the second embodiment of the present disclosure has a reduction of one of mask process. That is, the thin film transistor substrate according to the second embodiment may have the same advantages as the first embodiment as well as having a further merit of a reduction of mask processes.

Third Embodiment

Figure 6:
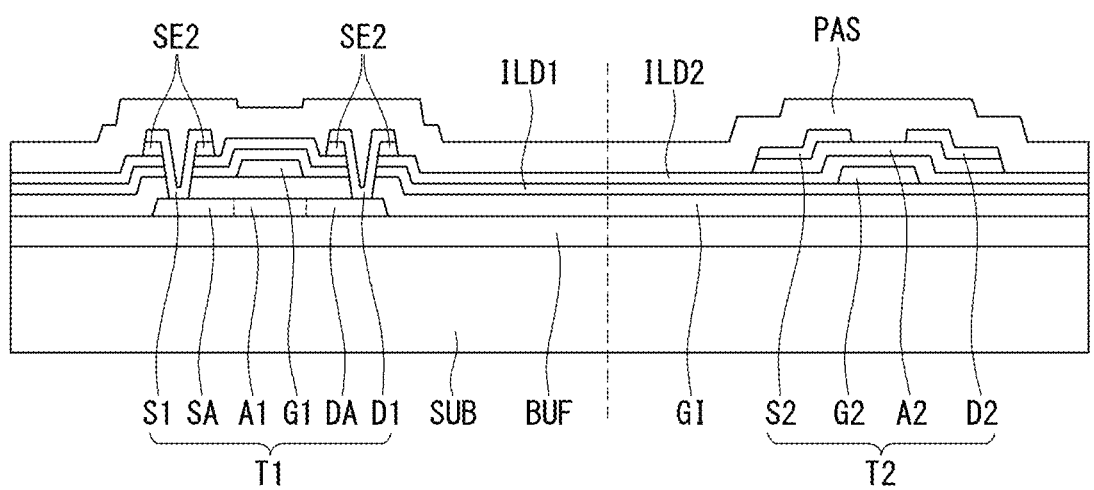
FIG. 6 is a cross sectional view illustrating a structure of a thin film transistor substrate for a flat panel display in which two different type thin film transistors are formed according to a third embodiment of the present disclosure.

FIG. 6 is a cross sectional view illustrating a structure of a thin film transistor substrate for a flat panel display in which two different types of thin film transistors are formed, according to a third embodiment of the present disclosure.

The thin film transistor substrate according to the third embodiment is very similar that of the first embodiment and/or the second embodiment. However, in the third embodiment, the first gate electrode G1 of the first thin film transistor T1 and the second gate electrode G2 of the second thin film transistor T2 may be disposed at different layers from each other. Further, because the first and the second gate electrodes G1 and G2 are disposed on different layers, the intermediate insulating layer ILD has a two layered structure.

In detail, the intermediate insulating layer ILD comprises a first intermediate insulating layer ILD1 and the second intermediate insulating layer ILD2. The first intermediate insulating layer ILD1 is deposited on the first gate electrode G1 as covering the area where the first thin film transistor T1 and the second thin film transistor T2 are disposed. The second gate electrode G2 is disposed on the first intermediate insulating layer ILD1. The second intermediate insulating layer ILD2 is deposited on the second gate electrode G2 to cover an area where the first thin film transistor T1 and the second thin film transistor T2 are disposed.

The first intermediate insulating layer ILD1 may include a material, such as a silicon nitride SiNx, having a sufficient amount of hydrogen particles such that the hydrogen particles are diffused into the first semiconductor layer A1 of the first thin film transistor T1. In the interim, the second intermediate insulating layer ILD2 acts as a gate insulating layer as stacked on the second gate electrode G2. Further, on the second intermediate insulating layer ILD2, the second semiconductor layer A2 of the second thin film transistor T2 is disposed. Therefore, it is desired that not too much amount of the hydrogen particles included into the first intermediate insulating layer ILD1 diffuse into the second semiconductor layer A2 during the thermal treatment. That is, the second intermediate insulating layer ILD2 may include a material, such as a silicon oxide SiOx, having almost no hydrogen particles.

While not shown in figures, the first intermediate insulating layer (ILD1) may have a double layered structure in which the nitride layer is stacked on a lower oxide layer. In that case, the nitride layer may not cover the second area where the second thin film transistor T2 is disposed, but cover only the first area where the first thin film transistor T1 is disposed.

Considering the hydrogenation efficiency, the first intermediate insulating layer ILD1 made of the silicon nitride may have a thickness of 1,000 Å~3,000 Å. Considering the efficiency for preventing the hydrogen particles from diffusing too much and the function of the gate insulating layer for the second semiconductor layer T2, the second intermediate insulating layer ILD2 made of the silicon oxide may have a thickness of 1,000 Å~3,000 Å.

As explained with reference to the second embodiment, the second source-drain electrodes S2-D2 of the second thin film transistor T2 are formed with the second semiconductor layer A2 at the same time. Further, the first source-drain electrodes S1-D1 of the first thin film transistor T1 are formed with the second source-drain electrodes S2-D2 of the second thin film transistor T2, at the same time. As a result, in the view of the structure, the second semiconductor materials SE2 exist under the first source-drain electrodes S1-D1 of the first thin film transistors T1, while the second semiconductor layer A2 (the same material with the second semiconductor materials SE2) exists under the second source-drain electrodes S2-D2 of the second thin film transistor T2.

Figure 7:
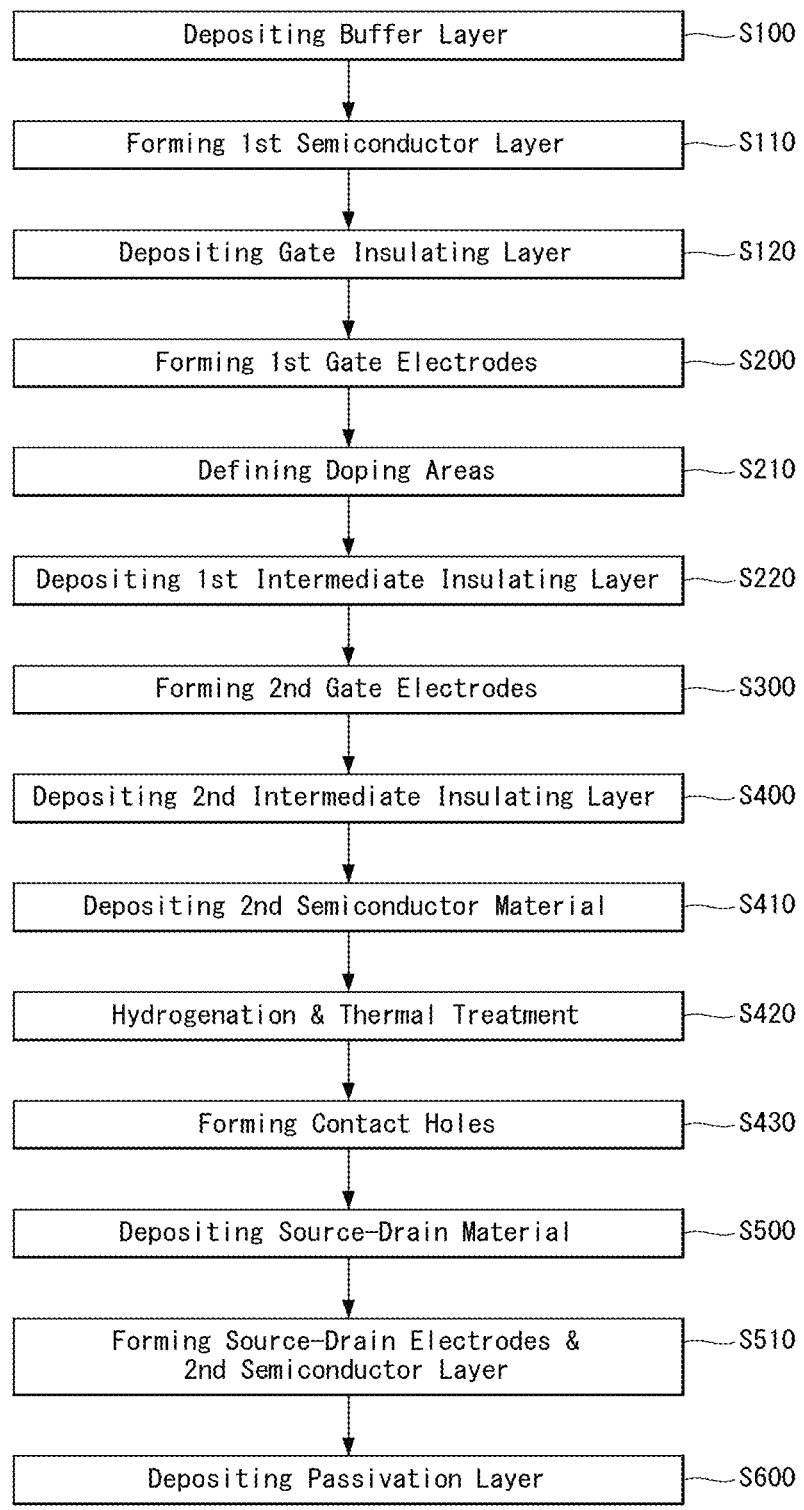
FIG. 7 is a flow chart illustrating a method for manufacturing the thin film transistor substrate for a flat panel display in which two different type thin film transistors are formed according to the third embodiment of the present disclosure.

As other elements are similar to those of the second embodiment, a detailed explanation will be omitted. Hereinafter, with reference to FIG. 7, a method for manufacturing the thin film transistor substrate for flat panel display according to the third embodiment of the present disclosure will be explained. FIG. 7 is a flow chart illustrating a method for manufacturing the thin film transistor substrate for a flat panel display in which two different types of thin film transistors are formed according to the third embodiment of the present disclosure.

In step S100, on a substrate SUB, a buffer layer BUF is deposited.

In step S110, on the buffer layer BUF, a first semiconductor material SE1 having an amorphous silicon (a-Si) material is deposited. By performing a crystallization process, the amorphous silicon material is converted into a polycrystalline silicon (poly-Si) material. Using a first mask process, the first semiconductor material SE1 having the polycrystalline silicon material is patterned to form a first semiconductor layer A1.

In step S120, a gate insulating layer GI is formed by depositing an insulating material, such as a silicon oxide, and then depositing an insulating material, such as an silicon, oxide on the whole surface of the substrate SUB having the first semiconductor layer A1. The gate insulating layer GI may include a silicon oxide layer having a thickness of 1,000 Å~1,500 Å.

In step S200, on the gate insulating layer GI, a gate metal layer is deposited. Using a second mask process, the gate metal layer is patterned to form a first gate electrode G1 for the first thin film transistor T1. The first gate electrode G1 overlaps a middle portion of the first semiconductor layer A1.

In step S210, using the first gate electrode G1 as a mask, impurity materials are doped into some portions of the first semiconductor layer A1 so that the doped areas define a source area SA and a drain area DA.

In step S220, on the whole surface of the substrate SUB having the first gate electrode G1, a first intermediate insulating layer ILD1 is deposited. While not shown in figures, the first intermediate insulating layer ILD1 may have the stacked structure in which a oxide layer is deposited on a nitride layer in a manner similar to that described with reference to the first embodiment. The thicknesses of the oxide layer and the nitride layer may be selected and/or decided in consideration of the hydrogen diffusion efficiency and the element properties. For example, to prevent the hydrogen particles from diffusing out too much, the nitride layer may be thinner than the oxide layer.

In step S300, on the first intermediate insulating layer ILD1, a gate metal layer is further deposited. Using a third mask process, the gate metal layer is patterned to form a second gate electrode G2. The second gate electrode G2 is disposed where the second thin film transistor T2 is formed.

In step S400, using an oxide inorganic material such as a silicon oxide SiOx, a second intermediate insulating layer ILD2 is deposited on the whole surface of the substrate SUB having the second gate electrode G2.

In step S410, on the second intermediate insulating layer ILD2, a second semiconductor material SE2 having an oxide semiconductor material is deposited. The second intermediate insulating layer ILD2 and the second semiconductor material SE2 can be stacked by the sequential depositing process.

In step S420, by applying a post-thermal process to the substrate SUB having the second semiconductor material SE2, the hydrogenation for the first semiconductor layer A1 including the polycrystalline silicon and the thermal treatment for the second semiconductor material SE2 including the oxide semiconductor material are performed at the same time. The post-thermal process may be performed at a temperature of 350~380° C. A large amount of the hydrogen particles included in the first intermediate insulating layer ILD1 will diffuse into the first semiconductor layer A1. However, the amount of the hydrogen particles diffused into the second semiconductor material SE2 may be restricted and/or controlled by the second intermediate insulating layer ILD2 having almost no hydrogen particles. In some cases, the hydrogenation process for the first semiconductor layer A1 may be performed separately from the thermal treatment for the second semiconductor material SE2.

In step S430, using a fourth mask process, the second semiconductor material SE2, the second intermediate insulating layer ILD2, the first intermediate insulating layer ILD1 and the gate insulating layer GI are patterned to form a source contact hole SH and a drain contact hole DH exposing one side portion and the other side portion of the first semiconductor layer A1, respectively.

In step S500, a source-drain metal material SD is deposited on the second intermediate insulating layer ILD2. Most portions of all source-drain metal material SD are stacked on the second semiconductor material SE2. Further, via the source contact hole SH, the source-drain metal material SD contacts the source area SA, one side portion of the first semiconductor layer A1. And, via the drain contact hole DH, the source-drain metal material SD contacts the drain area SA, the other side portion of the first semiconductor layer A1.

After that, using a fifth mask process, the source-drain metal material SD and the second semiconductor material SE2 are patterned at the same time to form a first source electrode S1 and the first drain electrode D1, the second source electrode S2 and the second drain electrode D2 and the second semiconductor layer A2. In this fifth mask process, a half-tone mask may be used for etching two stacked layers in the different thicknesses to form the source-drain electrodes and the semiconductor layer at the same time. As the same half-tone mask process as explained in the second embodiment may be used, the explanation of the half-tone mask process is not explained here.

In step S600, on the whole surface of the substrate SUB having the first thin film transistor T1 and the second thin film transistor T2, a passivation layer PAS is deposited.

Here, step S420 for the hydrogenation process and the thermal treatment may be conducted at any time between the step of S410 for depositing the second semiconductor material and the step of S600 for depositing the passivation layer, in convenience of manufacturing conditions and/or circumstances. For example, the step of S420 may be conducted after the step of S430 for forming the contact holes, or after the step of S500 for depositing the source-drain metal. Otherwise, step S420 may be conducted after the step of S510 for forming the source-drain and the second semiconductor layer.

In the method for manufacturing the thin film transistor substrate according to the third embodiment of the present disclosure, as the first gate electrode G1 and the second gate electrode G2 are formed in different layers, one more mask process may be needed as compared with the first embodiment. However, as the second semiconductor layer A2, the second source electrode S2 and the second drain electrode D2 are formed using one mask process, the total number of the mask processes in the third embodiment is the same with that of the first embodiment. As the results, the third embodiment has the advantage that the characteristics of two different types of the thin film transistors are stabilized on the same substrate without increasing of the number of the mask processes.

First Application Example

Figure 8:
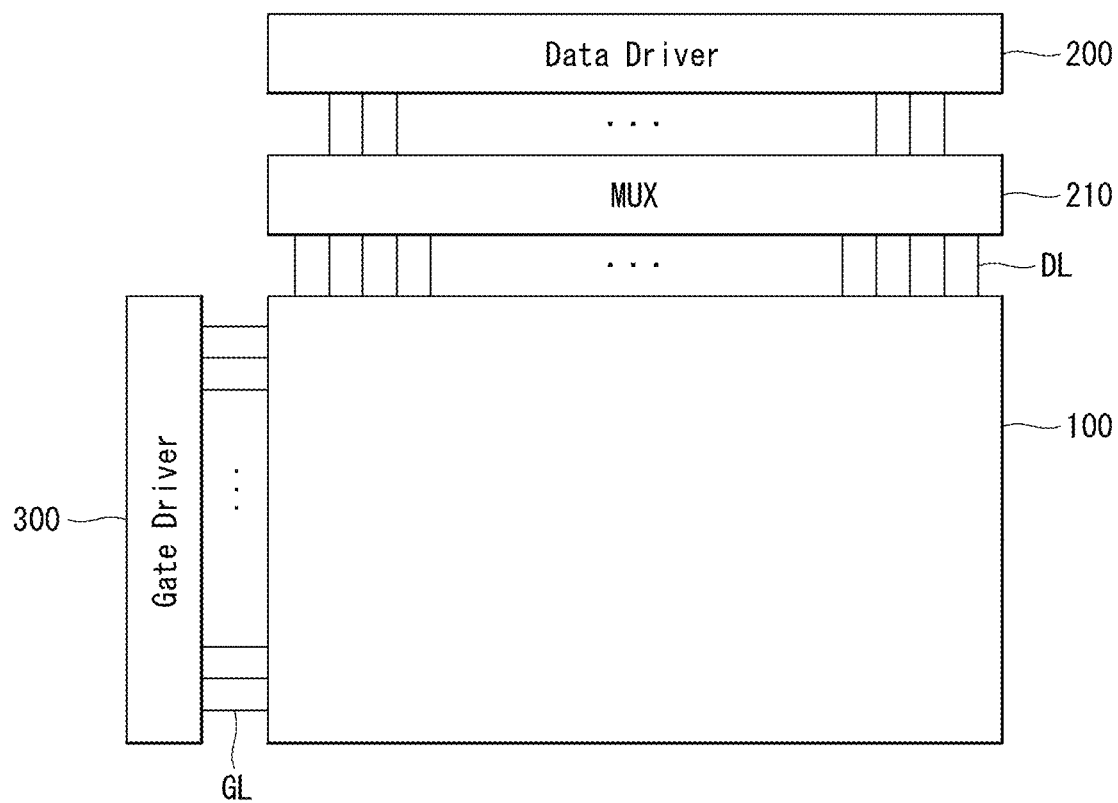
FIG. 8 is a block diagram illustrating a structure of a display according to a first application example of the present disclosure.

The thin film transistor substrate having two different type thin film transistors on the same substrate, above explained, can be applied to various type display including the flat panel display, the flexible display and/or the curved display. By forming the different two types of thin film transistors on the same substrate, various advantages can be achieved. FIG. 8 is a block diagram illustrating a structure of the display according to a first application example of the present disclosure. With reference to FIG. 8, advanced features and merits expects from the thin film substrate according to a first application example of the present invention will be explained.

The first and the second transistors T1 and T2 would be formed in each pixel of the display panel 100 for switching the data voltage applied to the pixel or for driving the pixel. In the case of an organic light emitting diode display, the second thin film transistor T2 may be a switch element for the pixel, and the first thin film transistor T1 may be a driver element. In the interim, by combining the first and the second thin film transistors T1 and T2, they may be applied to one switch element or one driver element.

For a mobile device or a wearable device, in order to reduce the power consumption, the lower speed driving method using a low frame rate is adopted. In this case, the frame frequency may be lowered for still image and/or images having a slower update interval. Here, when using the lower frame rate, at every time for changing the data voltage, the brightness of the display may be flashed. In some cases, as the discharging time interval is elongated, the brightness may be flickered at every data update period. By applying the first and the second thin film transistors T1 and T2 according to the present disclosure, the flicker problem at lower speed driving method can be prevented.

In the lower speed driving method, as the data update period is elongated, the leaked current amount of the switching thin film transistor may be increased. The leaked current of the switching thin film transistor may cause a voltage drop down of the storage capacitance and the drop down of the voltage between gate and source. The second thin film transistor having the oxide semiconductor material can be applied to the switch thin film transistor of the organic light emitting diode display. Because the thin film transistor including the oxide semiconductor material has lower off-current characteristics, the voltage drop down of the storage capacitance and/or of the gate electrode of the driving thin film transistor is prevented. The flicker phenomenon does not occur when using the lower speed driving method.

As polycrystalline silicon has characteristics of high mobility, by applying the first thin film transistor to the driving thin film transistor of the organic light emitting diode display, the current amount supplied to the organic light emitting diode can be enlarged. Therefore, by applying the second thin film transistor T2 to the switching thin film transistor and the first thin film transistor T1 to the driving thin film transistor, the organic light emitting diode display can achieve lower power consumption and better video quality.

As the thin film transistor substrate according to the present disclosure has excellent video quality without flickers even though the lower speed driving method is applied, it has a merit of being very suitable for applying to the mobile display or the wearable display. For the example of wearable wrist watch, the video data may be updated at every one second for reducing the power consumption. In that case, the frame frequency is 1 Hz. Using the arrangement of the present disclosure, excellent video quality without flickering can be achieved even though the video data is driven with lower frequency, such as 1 Hz or less. Further, for the mobile display or the wearable display, the frame rate for the still image can be remarkably lowered, so that the power consumption can be saved without any degradation of the video quality. As the result, the video quality of the mobile display and/or wearable display, and the life time of the battery can be elongated. In addition, the present disclosure can be applied to the electric book device (or 'E-Book') of which data update period is very long, without any degradation of the video quality.

At least one of the first and the second thin film transistors T1 and T2 may be embedded into a driver IC, for example shown in FIG. 8, e.g., any one of the data driver IC 200, the multiplexer (or 'MUX') 210, and the gate driver IC 300, for forming the driver IC. This driver IC writes and/or applies the data voltage to the pixel. In another case, any one of the first and the second thin film transistors T1 and T2 is disposed within the pixel, and the other is disposed in the driver IC. The data driver IC 200 converts the input video data into the voltage values and output the voltage values. The multiplexer 210 may reduce the number of the output channel of the data driver 200, by distributing the data voltages from the data driver 200 to the data lines DL by time-sharing or time-division method. The gate driver IC 300 outputs the scan signal (or 'gate signal') to the gate line GL synchronized to the data voltage for sequentially selecting the pixel line where the data voltage is applied. In order to reduce the output channel number of the gate driver IC 300, other multiplexers not shown in the figures may be further included between the gate driver IC 300 and the gate line GL. The multiplexer 210 and the gate driver IC 300 may be formed on the same thin film transistor substrate within the pixel array, as shown in FIG. 8. The multiplexer 210 and the gate driver IC 300 may be disposed within the non-display area NA and the pixel array may be disposed within the display area AA, as shown in FIG. 8.

The thin film transistor substrate according to the present disclosure may be applied to any type of active type display using an active matrix thin film transistor substrate such as the liquid crystal display, the organic light emitting diode display and/or the electrophoresis display device. Hereinafter, more application examples for the display using the thin film transistor substrate according to the present disclosure will be explained.

Second Application Example

Figure 9:
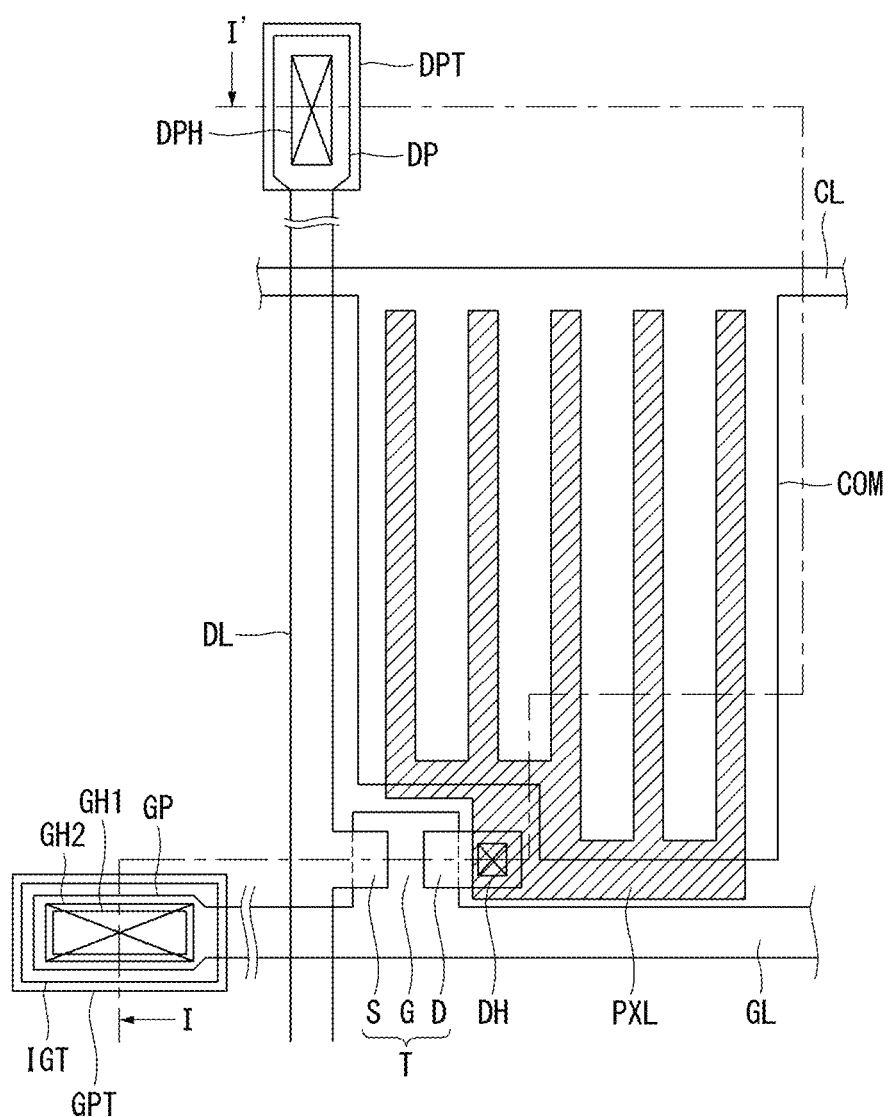
FIG. 9 is a plane view illustrating a thin film transistor substrate having an oxide semiconductor layer included in a fringe field type liquid crystal display according to a second application example of the present disclosure.
Figure 10:
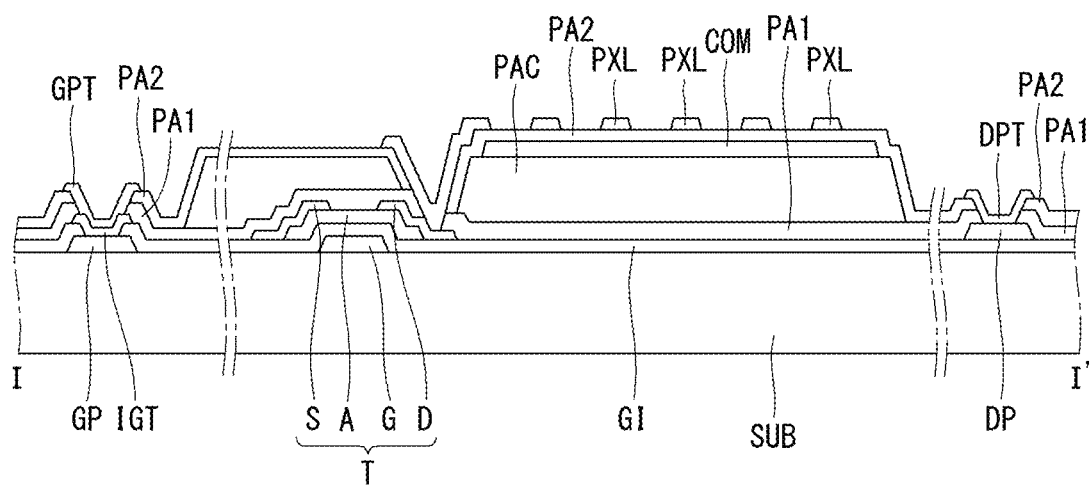
FIG. 10 is a cross-sectional view illustrating the structure of the thin film transistor substrate of FIG. 9 by cutting along line I-I' according to the second application example of the present disclosure.

FIG. 9 is a plane view illustrating a thin film transistor substrate having an oxide semiconductor layer included in a fringe field type liquid crystal display according to a second application example of the present disclosure. FIG. 10 is a cross-sectional view illustrating the structure of the thin film transistor substrate of FIG. 9 by cutting along line I-I' according to the second application example of the present disclosure.

The thin film transistor substrate having a metal oxide semiconductor layer shown in FIGS. 9 and 10 comprises a gate line GL and a data line DL crossing each other with a gate insulating layer GI there-between on a lower substrate SUB, and a thin film transistor T formed at each crossing portion. By the crossing structure of the gate line GL and the data line DL, a pixel area is defined.

The thin film transistor T comprises a gate electrode G branched (or 'extruded') from the gate line GL, a source electrode S branched from the data line DL, a drain electrode D facing the source electrode S, and a semiconductor layer A overlapping with the gate electrode G on the gate insulating layer GI for forming a channel area between the source electrode S and the drain electrode D.

At one end of the gate line GL, a gate pad GP is disposed for receiving the gate signal. The gate pad GP is connected to a gate pad intermediate terminal IGT through the first gate pad contact hole GH1 penetrating the gate insulating layer GI. The gate pad intermediate terminal IGT is connected to the gate pad terminal GPT through the second gate pad contact hole GH2 penetrating the first passivation layer PA1 and the second passivation layer PA2. Further, at one end of the data line DL, a data pad DP is disposed for receiving the pixel signal. The data pad DP is connected to a data pad terminal DPT through the data pad contact hole DPH penetrating the first passivation layer PA1 and the second passivation layer PA2.

In the pixel area, a pixel electrode PXL and a common electrode COM are formed with the second passivation layer PA2 there-between, to form a fringe electric field. The common electrode COM is connected to the common line CL disposed in parallel with the gate line GL. The common electrode COM is supplied with a reference voltage (or "common voltage") via the common line CL. For other cases, the common electrode COM has the one sheet electrode shape that covers the whole surface of the substrate SUB except the drain contact hole DH portions. That is, covering over the data line DL, the common electrode COM can work as a shield for the data line DL.

The common electrode COM and the pixel electrode PXL can have various shapes and positions according to the design purpose and environment. While the common electrode COM is supplied with a reference voltage having constant value, the pixel electrode PXL is supplied with a data voltage varying timely according to the video data. Therefore, between the data line DL and the pixel electrode PXL, a parasitic capacitance may be formed. Due to the parasitic capacitance, the video quality of the display may be degraded. Therefore, it is preferable that the common electrode COM is disposed at the lower layer and the pixel electrode PXL is disposed at the topmost layer.

In other words, on the first passivation layer PA1 covering the data line DL and the thin film transistor T, a planarization layer PAC is stacked thereon by thickly depositing an organic material having a low permittivity. Then, the common electrode COM is formed. And then, after depositing the second passivation layer PA2 to cover the common electrode COM, the pixel electrode PXL overlapping with the common electrode is formed on the second passivation layer PA2. In this structure, the pixel electrode PXL is far from the data line DL by the first passivation layer PA1, the planarization layer PAC and the second passivation layer PA2, so that it is possible to reduce the parasitic capacitance between the data line DL and the pixel electrode PXL. In other case, the pixel electrode PXL may be disposed at the lower layer and the common electrode COM is disposed at the topmost layer.

The common electrode COM may have a rectangular shape corresponding to the pixel area. The pixel electrode PXL may have the shape of a plurality of segments. Especially, the pixel electrode PXL is vertically overlapped with the common electrode COM with the second passivation layer PA2 there-between. Between the pixel electrode PXL and the common electrode COM, the fringe electric field is formed. By this fringe electric field, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel area may be changed so as to represent desired gray scale.

In FIGS. 9 and 10 for explaining the second application example of the present disclosure, in convenience, the thin film transistor T of the liquid crystal display is shown briefly. The first and/or the second thin film transistors T1 and/or T2 explained from the first to third embodiments of the present disclosure can be applied to this thin film transistor. In one example, for a low speed driving, the second thin film transistor T2 having the oxide semiconductor material can be applied to the thin film transistor T. In another example, for low power consumption, the first thin film transistor T1 having the polycrystalline semiconductor material may be applied to the thin film transistor T. In still other example, the thin film transistor T may be formed as including the first and the second thin film transistors T1 and T2 and they are connected so that their performance and characteristics can compensate each other.

Third Application Example

Figure 11:
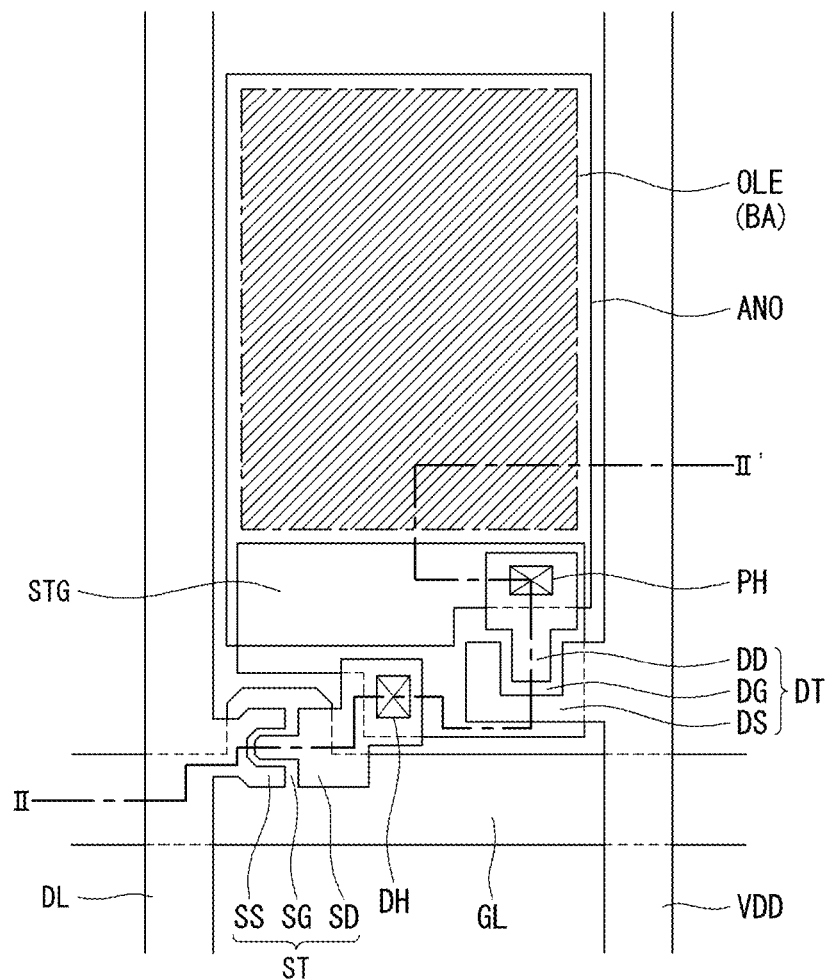
FIG. 11 is a plane view illustrating the structure of one pixel for the active matrix type organic light emitting diode display having active switching elements, such as thin film transistors according to a third application embodiment of the present disclosure.
Figure 12:
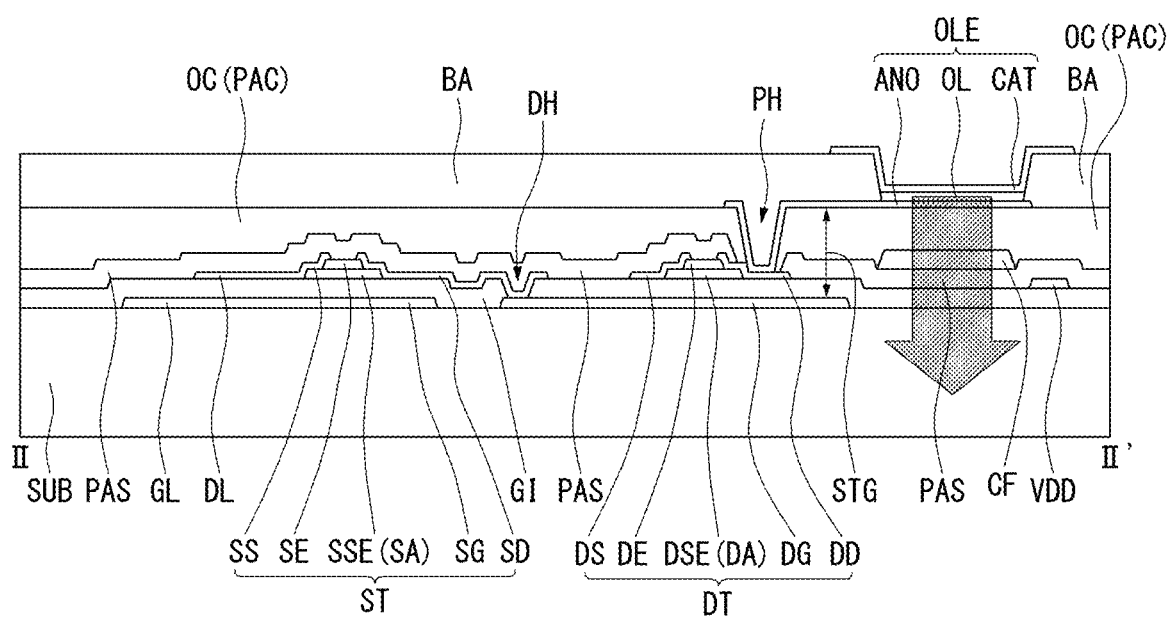
FIG. 12 is a cross sectional view illustrating the structure of the organic light emitting diode display along cutting line II-II' in FIG. 11 according to the third application embodiment of the present disclosure.

FIG. 11 is a plane view illustrating the structure of one pixel for the active matrix type organic light emitting diode display having active switching elements, such as thin film transistors, according to a third application example of the present disclosure. FIG. 12 is a cross sectional view illustrating the structure of the organic light emitting diode display along cutting line II-IF in FIG. 11 according to the third application example of the present disclosure.

With reference to FIGS. 11 and 12, the active matrix type organic light emitting diode display comprises a switching thin film transistor ST, a driving thin film transistor DT connected to the switching thin film transistor ST, and an organic light emitting diode OLE connected to the driving thin film transistor DT.

The switching thin film transistor ST is formed where a gate line GL and a data line DL are crossing each other, on a substrate SUB. Supplying the data voltage from the data line DL to the gate electrode DG of the driving thin film transistor DT and to the storage capacitance STG replying the scan signal, the switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG a source electrode SS and a drain electrode SD. Controlling the amount of the current applied to the organic light emitting diode OLE of the pixel according to the gate voltage, the driving thin film transistor DT acts for driving the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, an organic light emitting layer OL is disposed. The cathode electrode CAT is connected to the ground line Vss.

With more detailed reference to FIG. 12, on the substrate SUB of the active matrix organic light emitting diode display, the gate electrodes SG and DG of the switching thin film transistor ST and the driving thin film transistor DT, respectively are disposed. On the gate electrodes SG and DG the gate insulator GI is deposited. On the gate insulator GI overlapping with the gate electrodes SG and DG the semiconductor layers SA and DA are disposed, respectively. On the semiconductor layer SA and DA, the source electrodes SS and DS and the drain electrodes SD and DD facing and separated from each other, respectively, are disposed. The drain electrode SD of the switching thin film transistor ST is connected to the gate electrode DG of the driving thin film transistor DT via the drain contact hole DH penetrating the gate insulator GI. The passivation layer PAS is deposited on the substrate SUB having the switching thin film transistor ST and the driving thin film transistor DT.

A color filer CF is disposed at the area where the anode electrode ANO is disposed. The color filter CF may have as large of an area as possible. For example, it may be desired to overlap with some portions of the data line DL, the driving current line VDD and/or the gate line GL. The upper surface of the substrate having these thin film transistors ST and DT and color filters CF is not in an even and/or smooth condition, but in uneven and/or rugged condition having many steps. In order that the organic light emitting diode display has good luminescent quality over the whole display area, the organic light emitting layer OL should have an even or smooth surface. So, to make the upper surface in a planar and even condition, the planar layer PAC or the overcoat layer OC is deposited on the whole surface of the substrate SUB.

Then, on the overcoat layer OC, the anode electrode ANO of the organic light emitting diode OLED is disposed. Here, the anode electrode ANO is connected to the drain electrode DD of the driving thin film transistor DT through the pixel contact hole PH penetrating the overcoat layer OC and the passivation layer PAS.

On the substrate SUB having the anode electrode ANO, a bank (or "bank pattern") BA is disposed over the area having the switching thin film transistor ST, the driving thin film transistor DT and the various lines DL, GL and VDD, for defining the pixel area. The exposed portion of the anode electrode ANO by the bank BA is the light emitting area. On the anode electrode ANO exposed from the bank BA, the organic light emitting layer OL is deposited. On the organic light emitting layer OL, the cathode electrode ACT is deposited. For the case that the organic light emitting layer OL has a material emitting the white light, each pixel can represent various colors by the color filter CF disposed under the anode electrode ANO. The organic light emitting diode display as shown in FIG. 12 is the bottom emission type display in which the visible light is radiated to the bottom direction of the display substrate.

Between the gate electrode DG of the driving thin film transistor DT and the anode electrode ANO, a storage capacitance STG may be formed. By connected to the driving thin film transistor DT, the storage capacitance STG keeps the voltage supplied to the gate electrode DG of the driving thin film transistor DT from the switching thin film transistor ST in stable condition.

Using the thin film transistor substrate like the above explanations, an active type flat panel display having good properties can be acquired. Especially, to ensure excellent driving properties, the active layer of the thin film transistor may include a metal oxide semiconductor material.

The metal oxide semiconductor material may be degraded when it is working exposed by the light for a long time. Therefore, the thin film transistor having a metal oxide semiconductor material may include a structure for blocking light from outside of the upper portion and/or the lower portion of the thin film transistor. For example, for the above mentioned thin film transistor substrates, it is preferable that the thin film transistor would be formed in the bottom gate structure. That is, the light induced from the outside of the substrate, especially from the lower side of the substrate facing the observer, can be blocked by the gate electrode G including an opaque metal material.

The thin film transistor substrate for the flat panel display has a plurality of pixel area disposed in a matrix manner. Further, each pixel area includes at least one thin film transistor. That is, over the whole substrate, a plurality of thin film transistor is disposed. The plurality of pixel area and the plurality of thin film transistor are used for the same purpose and they should have the same quality and characteristics, so that they have the same structure.

However, in some cases, the thin film transistors may be formed as having different characteristics from each other. For the example of the organic light emitting diode display, in one pixel area, at least one switching thin film transistor ST and at least one driving thin film transistor DT are disposed. As the purposes of the switching thin film transistor ST and the driving thin film transistor DT are different from each other, the characteristics of the two are different each other as well. To do so, the switch thin film transistor ST and the driving thin film transistor DT may have the same structure and the same semiconductor material, but the channel layers of them have different sizes for optimizing their characteristics. Otherwise, compensating thin film transistor may further be included for supporting any specific functions or properties of any thin film transistor.

In FIGS. 11 and 12, the switching thin film transistor ST and the driving thin film transistor DT of the organic light emitting diode display of the third application example are shown. The first and/or the second thin film transistors T1 and/or T2 explained from the first to third embodiments of the present disclosure can be applied to this thin film transistor. For example, the second thin film transistor T2 having the oxide semiconductor material can be applied for the switching thin film transistor ST. The first thin film transistor T1 having the polycrystalline semiconductor material may be applied for the driving thin film transistor DT. Therefore, by including the first and the second thin film transistors T1 and T2 on one substrate, theit performance and characteristics can compensate each other.

Fourth Application Example

For still another example, a driver element (or 'driver IC') may be formed in the non-display area of the same thin film transistor substrate for the flat panel display. Hereinafter, with reference to FIGS. 13 and 14, a thin film transistor substrate having the driver IC on the same substrate will be explained.

Figure 13:
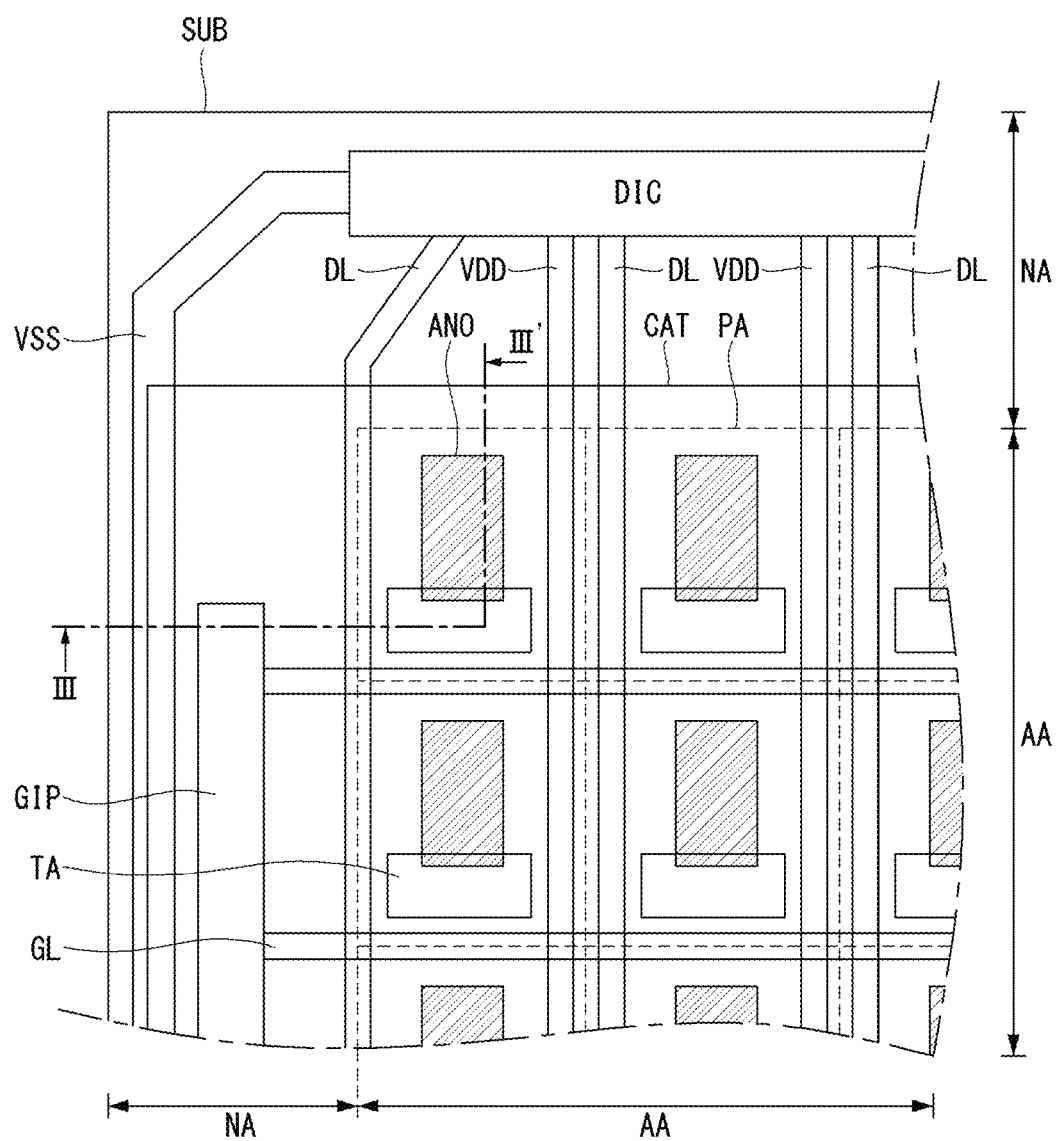
FIG. 13 is an enlarged plane view illustrating a structure of an organic light emitting diode display according to a fourth application embodiment of the present disclosure.
Figure 14:
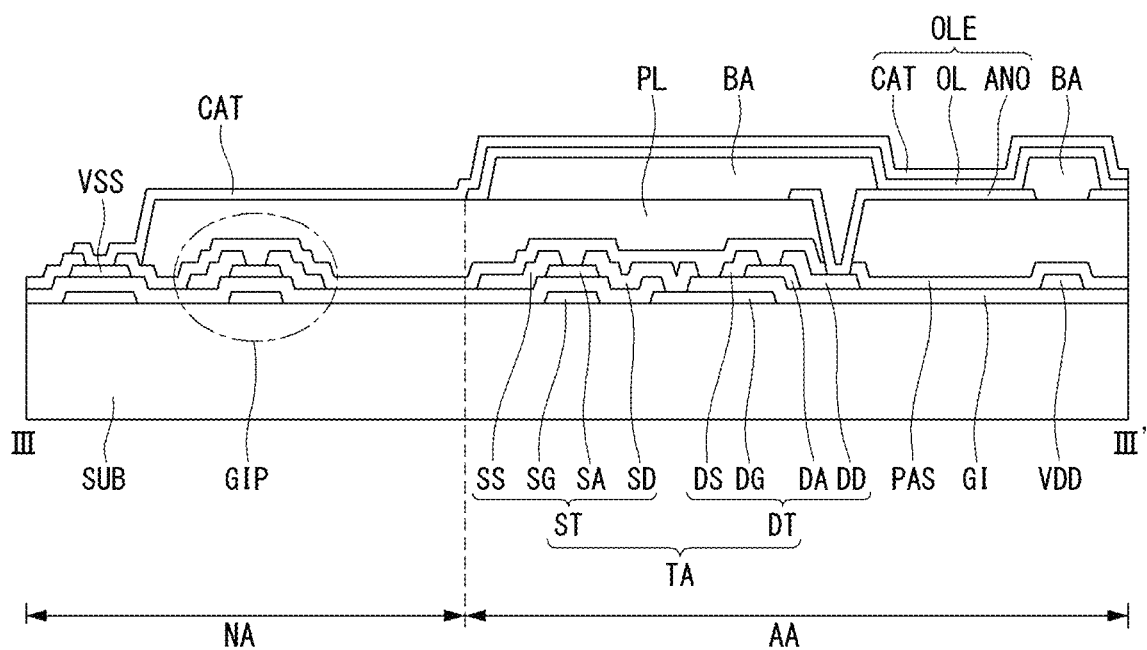
FIG. 14 is a cross sectional view illustrating a structure of the organic light emitting diode display along cutting line of in FIG. 13 according to the fourth application embodiment of the present disclosure.

FIG. 13 is an enlarged plane view illustrating a structure of an organic light emitting diode display according to a fourth application example of the present disclosure. FIG. 14 is a cross sectional view illustrating a structure of the organic light emitting diode display along cutting line in FIG. 13, according to a fourth application example of the present disclosure. Here, because the explanation for the thin film transistor substrate having a driver therein is similar, a detailed explanation about the thin film transistor substrate and the organic light emitting diode will be omitted.

The plane structure of the organic light emitting diode display according to the fourth application example will be explained in detail with reference to FIG. 10. An organic light emitting diode display according to the fourth application example comprises a substrate SUB including a display area AA for representing the video information and a non-display area NA having various elements for driving the elements in the display area AA. In the display area AA, a plurality of pixel areas PA disposed in a matrix manner are defined. In FIG. 13, the pixel area PA is illustrated as the dotted line.

For example, the pixel areas PA can be defined as an N (row)×M (column) matrix. However, the disposed pattern is not restricted this manner, but has various types. Each of the pixel areas PA has the same size or a different size. With one unit pixel having three sub pixels including red (R), green (G) and blue (B) sub pixels, the unit pixels are regularly disposed. Explaining a simple structure, the pixel area PA can be defined by the crossing structure of a plurality of gate lines GL running in a horizontal direction and a plurality of data lines DL running in a vertical direction.

In the non-display area NA defined as the peripheral area surrounding the pixel area PA, a data driving integrated circuit DIC for supplying the video data to the data line DL and a gate driving integrated circuit GIP for supplying the scan signal to the gate line GL are disposed. For that case of higher resolution display panel than VGA panel in which more data lines DL and more driving current lines VDD may be used, the data driving integrated circuit DIC may be externally installed from the substrate SUB, and data contact pads may be disposed on the substrate SUB instead of the data driving integrated circuit DIC.

In order to simply show the structure of the display, the gate driving integrated circuit GIP is formed on one side portion of the substrate SUB directly. The ground line Vss for supplying the ground voltage may be disposed at the outermost side of the substrate SUB. The ground line Vss is disposed so as to receive the ground voltage from an external device located out of the substrate SUB, and to supply the ground voltage to the data driving integrated circuit DIC and the gate driving integrated circuit GIP. For example, the ground line Vss may be linked to the data driving integrated circuit DIC disposed at the upper side of the substrate SUB and to the gate driving integrated circuit GIP disposed at the right side and/or left side of the substrate SUB so as to surround the substrate SUB.

At each pixel area PA, the main elements, such as an organic light emitting diode and thin film transistors for driving the organic light emitting diode, are disposed. The thin film transistor is disposed at the thin film transistor area TA defined at one side of the pixel area PA. The organic light emitting diode includes an anode electrode ANO, a cathode electrode CAT and an organic light emission layer OL inserted between these two electrodes. The actual emission area is decided by the area of the organic light emission layer OL overlapping the anode electrode ANO.

The anode electrode ANO has a shape as to occupy some area of the pixel area PA and is connected to the thin film transistor formed in the thin film transistor area TA. The organic light emission layer OL is deposited on the anode electrode ANO. The cathode electrode CAT is deposited on the organic light emission layer OL to cover a whole surface of the display area AA having the pixel areas PA.

The cathode electrode CAT may go over the gate driving integrated circuit GIP and contact the ground line Vss disposed at the outer side. So, the ground voltage can be supplied to the cathode electrode CAT through the ground line Vss. The cathode electrode CAT receives the ground voltage and the anode electrode ANO receives the voltage corresponding to the video data and then, by the voltage difference between the cathode electrode CAT and the anode electrode ANO, the organic light emission layer OL radiates the light to represent the video information.

The cross-sectional structure of the organic light emitting diode display according to the fourth application example will be explained in detail with reference to FIG. 14. On the substrate SUB, a non-display area NA and a display area AA are defined. The non-display area NA includes an area where the gate driving integrated circuit GIP and the ground line Vss are disposed. The display area AA includes an area where a switching thin film transistor ST, a driving thin film transistor DT and an organic light emitting diode OLE are defined.

The gate driving integrated circuit GIP has thin film transistors that are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planar layer PL are sequentially deposited. On the planar layer PL, an anode electrode ANO having an isolation shape within the pixel area PA is disposed. The anode electrode ANO connects to the drain electrode DD of the driving thin film transistor DT through the contact hole penetrating the passivation layer PAS and the planar layer PL.

On the substrate SUB having the anode electrode ANO, a bank BA is deposited for defining the emission area. By patterning the bank BA, the most center portions of the anode electrode ANO are exposed. On the exposed anode electrode ANO, an organic light emission layer OL is deposited. Depositing a transparent conductive material on the bank BA and the organic light emission layer OL, the cathode electrode CAT is stacked. The organic light emitting diode OLED including the anode electrode ANO, the organic light emission layer OL and the cathode electrode CAT is disposed.

In a case where the organic light emission layer OL generates the white light, color filters CF may be further included for representing full color video information. In that case, the organic light emission layer OL may be deposited to cover the whole surface of the display area AA.

The cathode electrode CAT is expanded over the gate driving integrated circuit GIP so that it may cover the display area AA and the non-display area NA and contact the ground line Vss disposed at the outer circumstance of the substrate SUB. As the result, the ground (or, reference) voltage can be supplied to the cathode electrode CAT via the ground line Vss.

In addition, the ground line Vss may be formed at the same layer and made of the same material with the gate electrodes SG and DG In that case, the cathode electrode CAT can be connected to the ground line Vss through the contact hole penetrating the passivation layer PAS and the gate insulating layer GI over the ground line Vss. Otherwise, the ground line Vss may be formed at the same layer and made of the same material with the source-drain electrodes SS-SD and DS-DD. In this case, the cathode electrode CAT can be connected to the ground line Vss through the contact hole penetrating the passivation layer PAS over the ground line Vss.

In FIGS. 13 and 14, the switching thin film transistor ST and the driving thin film transistor DT of the organic light emitting diode display of the fourth application example are shown. The first and/or the second thin film transistors T1 and/or T2, explained in the first to third embodiments of the present disclosure, can be applied to these thin film transistors. For example, the second thin film transistor T2 having the oxide semiconductor material can be applied for the switching thin film transistor ST. The first thin film transistor T1 having the polycrystalline semiconductor material may be applied for the driving thin film transistor DT. Further, for the gate driver IC GIP, the first thin film transistor T1 having the polycrystalline semiconductor material may be applied. For example, for the gate driver IC GIP, the C-MOS type thin film transistor may include P-MOS type and N-MOS type thin film transistors.

The thin film transistor substrate for flat panel display according to the present disclosure comprises two different type thin film transistors on the same substrate so that the disadvantages of any one type thin film transistor can be compensated by the other type thin film transistor. For example, with a thin film transistor having low frequency driving characteristics, the display can have a low power consumption property, and the display can be applied to portable and/or wearable appliances. Further, according to the method for manufacturing the thin film transistor substrate, because the channel layer and the source-drain electrodes of any one thin film transistor may formed at the same time using a half-tone mask, the number of the mask processes can be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a thin film transistor substrate, comprising:

forming a first semiconductor layer on a substrate;
depositing a gate insulating layer covering the first semiconductor layer;
forming a first gate electrode and a second gate electrode on the gate insulating layer;
depositing an intermediate insulating layer covering the first gate electrode and the second gate electrode;
depositing a second semiconductor material on the intermediate insulating layer;
exposing a first portion and a second portion of the first semiconductor layer by forming first and second contact holes through the second semiconductor material, the intermediate insulating layer, and the gate insulating layer;
depositing a source-drain metal material on the second semiconductor material; and
forming a first source electrode, a first drain electrode, a second source electrode, a second drain electrode and a second semiconductor layer, by patterning the source-drain metal material and the second semiconductor material at the same time.

2. A method for manufacturing a thin film transistor substrate, comprising:
forming a first semiconductor layer on a substrate;
depositing a gate insulating layer covering the first semiconductor layer;
forming a first gate electrode on the gate insulating layer;
depositing a lower intermediate insulating layer on the first gate electrode and the gate insulating layer;
forming a second gate electrode on the lower intermediate insulating layer, the first gate electrode being under the lower intermediate insulating layer;
depositing an upper intermediate insulating layer on the lower intermediate insulating layer;
depositing a second semiconductor material on the upper intermediate insulating layer;
exposing a first portion and a second portion of the first semiconductor layer by forming first and second contact holes through the second semiconductor material, the upper intermediate insulating layer, the lower intermediate insulating layer and the gate insulating layer;
depositing a source-drain metal material on the second semiconductor material; and
forming a first source electrode, a first drain electrode, a second source electrode, a second drain electrode and a second semiconductor layer, by patterning the source-drain metal material and the second semiconductor material at the same time.

* * * * *